United States Patent
Shibata et al.

(10) Patent No.: US 11,667,842 B2
(45) Date of Patent: *Jun. 6, 2023

(54) LAMINATE, ORGANIC ELECTROLUMINESCENT DEVICE, AND LIQUID CRYSTAL DISPLAY DEVICE

(71) Applicant: FUJIFILM Corporation, Tokyo (JP)

(72) Inventors: Naoya Shibata, Kanagawa (JP); Nobuyuki Akutagawa, Kanagawa (JP); Keisuke Yoshimasa, Kanagawa (JP); Hiroaki Sata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/002,881

(22) Filed: Aug. 26, 2020

(65) Prior Publication Data

US 2020/0392408 A1 Dec. 17, 2020

Related U.S. Application Data

(63) Continuation of application No. PCT/JP2019/007232, filed on Feb. 26, 2019.

(30) Foreign Application Priority Data

Feb. 28, 2018 (JP) .............................. JP2018-034733
Sep. 26, 2018 (JP) .............................. JP2018-180174

(51) Int. Cl.
*G02F 1/13363* (2006.01)
*C09K 19/38* (2006.01)
(Continued)

(52) U.S. Cl.
CPC ........ *C09K 19/3861* (2013.01); *G02B 5/3016* (2013.01); *G02F 1/13363* (2013.01);
(Continued)

(58) Field of Classification Search
CPC .... C09K 19/3861; C09K 19/04; C09K 19/34; C09K 2019/0448; C09K 2323/00;
(Continued)

(56) References Cited

U.S. PATENT DOCUMENTS

2010/0253892 A1 10/2010 Higashi et al.
2013/0107173 A1* 5/2013 Takeda ................. G02B 5/3025
359/241

(Continued)

FOREIGN PATENT DOCUMENTS

CN 101876721 A 11/2010
CN 106867418 A 6/2017

(Continued)

OTHER PUBLICATIONS

Office Action, issued by the Japanese Patent Office dated Oct. 5, 2021, in connection with Japanese Patent Application No. 2020-503514.

(Continued)

*Primary Examiner* — Ruiyun Zhang
(74) *Attorney, Agent, or Firm* — Edwards Neils LLC; Jean C. Edwards, Esq.

(57) ABSTRACT

Provided is a laminate, which has a polarizer and an optically anisotropic layer and is excellent in thermal durability, and an organic electroluminescent device and a liquid crystal display device, which include the laminate. The laminate has two substrates and a polarizing plate disposed between the two substrates, in which the polarizing plate has a polarizer and an optically anisotropic layer, the polarizer contains a polyvinyl alcohol-based resin, the optically anisotropic layer is formed of a composition containing a polymerizable liquid crystal compound represented by General Formula (I): $L_1$-$G_1$-$D_1$-Ar-$D_2$-$G_2$-$L_2$, a moisture permeabil-
(Continued)

ity of the substrate is $10^{-3}$ g/m²·day or less, and a water content of the polarizing plate is 3.0 g/m² or less.

20 Claims, 1 Drawing Sheet

(51) Int. Cl.
    *G02B 5/30*     (2006.01)
    *G02F 1/1335*     (2006.01)
    *C09K 19/04*     (2006.01)
    *H01L 27/32*     (2006.01)

(52) U.S. Cl.
    CPC .......... *G02F 1/133528* (2013.01); *C09K 2019/0448* (2013.01); *C09K 2323/031* (2020.08); *C09K 2323/06* (2020.08); *C09K 2323/061* (2020.08); *G02F 1/133565* (2021.01); *G02F 1/133638* (2021.01); *H01L 27/3232* (2013.01)

(58) Field of Classification Search
    CPC .......... C09K 2323/03; C09K 2323/031; C09K 2323/035; C09K 2323/06; C09K 2323/061; G02B 5/3083; G02B 5/3016; G02F 1/133633; G02F 1/133528
    USPC ......... 428/1.1, 1.3, 1.33, 1.6, 1.62; 349/117, 349/194
    See application file for complete search history.

(56) References Cited

U.S. PATENT DOCUMENTS

| | | |
|---|---|---|
| 2013/0286480 A1 | 10/2013 | Hirota |
| 2015/0175564 A1 | 6/2015 | Sakamoto et al. |
| 2015/0277006 A1 | 10/2015 | Takasago et al. |
| 2017/0101553 A1 | 4/2017 | Takarada et al. |
| 2017/0210709 A1 | 7/2017 | Androsov et al. |

FOREIGN PATENT DOCUMENTS

| | | | |
|---|---|---|---|
| JP | 2010117537 A | * | 5/2010 |
| JP | 2011-207765 A | | 10/2011 |
| JP | 2012-064378 A | | 3/2012 |
| JP | 2013-228574 A | | 11/2013 |
| JP | 2014-102353 A | | 6/2014 |
| JP | 2016-053709 A | | 4/2016 |
| WO | 2014/010325 A1 | | 1/2014 |

OTHER PUBLICATIONS

International Search Report issued in PCT/JP2019/007232 dated May 28, 2019.
Written Opinion issued in PCT/JP2019/007232 dated May 28, 2019.
International Preliminary Report on Patentability completed by WIPO dated Sep. 1, 2020 in connection with International Patent Application No. PCT/JP2019/007232.
Office Action, issued by the Korean Patent Office dated Sep. 27, 2021, in connection with corresponding Korean Patent Application No. 10-2020-7024031.
Office Action, issued by the Japanese Patent Office dated Feb. 24, 2021, in connection with Japanese Patent Application No. 2020-503514.
Office Action, issued by the State Intellectual Property Office dated Mar. 16, 2022, in connection with Chinese Patent Application No. 201980015948.5.
Office Action, issued by the State Intellectual Property Office dated Oct. 26, 2021, in connection with Chinese Patent Application No. 201980015948.5.
Office Action, issued by the Korean Intellectual Property Office dated Mar. 14, 2022, in connection with Korean Patent Application No. 10-2020-7024031.
Office Action, issued by the State Intellectual Property Office dated Jun. 17, 2022, in connection with Chinese Patent Application No. 201980015948.5.

* cited by examiner

LAMINATE, ORGANIC ELECTROLUMINESCENT DEVICE, AND LIQUID CRYSTAL DISPLAY DEVICE

CROSS-REFERENCE TO RELATED APPLICATIONS

This application is a Continuation of PCT International Application No. PCT/JP2019/007232 filed on Feb. 26, 2019, which was published under PCT Article 21(2) in Japanese, and which claims priority under 35 U.S.C. § 119(a) to Japanese Patent Application No. 2018-034733 filed on Feb. 28, 2018 and Japanese Patent Application No. 2018-180174 filed on Sep. 26, 2018. The above applications are hereby expressly incorporated by reference, in their entirety, into the present application.

BACKGROUND OF THE INVENTION

1. Field of the Invention

The present invention relates to a laminate, an organic electroluminescent device, and a liquid crystal display device.

2. Description of the Related Art

In the related art, a polarizing plate having an optically anisotropic layer and a polarizer has been used for an organic electroluminescent device, a liquid crystal display device, or the like for the purpose of optical compensation, antireflection, or the like.

In recent years, development of a polarizing plate (so-called broadband polarizing plate) which can provide the same effects to white light which is a composite wave having light rays in a visible light range coexisting therein, in correspondence to light rays at all wavelengths, has been in progress, and in particular, due to a demand for reduction in a thickness of a device to which a polarizing plate is applied, reduction in a thickness of an optically anisotropic layer included in the polarizing plate has also been demanded.

In response to the above demands, WO2014/010325A and JP2011-207765A each propose a use of a polymerizable liquid crystal compound having reciprocal wavelength dispersibility as a polymerizable compound which is used for forming an optically anisotropic layer.

SUMMARY OF THE INVENTION

However, it has been found that in a case where a polarizing plate having an optically anisotropic layer which is formed of the polymerizable liquid crystal (polymerizable liquid crystal compound) having reciprocal wavelength dispersibility described in WO2014/010325A and JP2011-207765A is manufactured, the polarizing plate is interposed between substrates (for example, glass substrates) with a low moisture permeability from both sides in accordance with a practical mode (for example, a circularly polarizing plate for the purpose of antireflection of an organic electroluminescence-type smartphone), and the obtained laminate is exposed for a long period of time under the condition of a high temperature, reddish unevenness occurs in an in-plane central portion of the laminate. As a result of the analysis, it has been clarified that an in-plane retardation (Re) significantly varies in a reddish region, thereby causing a change in a tint. Therefore, development of a laminate having a polarizer and an optically anisotropic layer, in which a change in an in-plane retardation is suppressed even in a case of being exposed to a high temperature for a long period of time, was desired. Hereinafter, suppression of a change in an in-plane retardation in a case where a laminate is exposed to a high temperature will be expressed as excellent thermal durability.

Accordingly, an object of the present invention is to provide a laminate which has a polarizer and an optically anisotropic layer and is excellent in thermal durability.

In addition, another object of the present invention is to provide an organic electroluminescent device and a liquid crystal display device, which include the laminate.

As a result of intensive studies on the objects, the present inventors have found that the objects can be accomplished by the following configurations.

(1) A laminate comprising: two substrates; and a polarizing plate disposed between the two substrates, in which the polarizing plate has a polarizer and an optically anisotropic layer, the polarizer contains a polyvinyl alcohol-based resin, the optically anisotropic layer is formed of a composition containing a polymerizable liquid crystal compound represented by General Formula (I), a moisture permeability of the substrate is $10^{-3}$ g/m$^2$·day or less, and a water content of the polarizing plate is 3.0 g/m$^2$ or less.

(2) The laminate according to (1), in which the water content of the polarizing plate is 2.3 g/m$^2$ or less.

(3) The laminate according to (1) or (2), in which a thickness of the polarizer is less than 10 μm.

(4) The laminate according to any one of (1) to (3), in which Re(450), which is an in-plane retardation of the optically anisotropic layer at a wavelength of 450 nm, Re(550), which is an in-plane retardation of the optically anisotropic layer at a wavelength of 550 nm, and Re(650), which is an in-plane retardation of the optically anisotropic layer at a wavelength of 650 nm satisfy a relationship of Re(450)≤Re(550)≤Re(650).

(5) The laminate according to any one of (1) to (4), in which the optically anisotropic layer is a positive A-plate.

(6) The laminate according to any one of (1) to (5), in which the optically anisotropic layer is a λ/4 plate.

(7) The laminate according to any one of (1) to (6), further comprising a polarizer protective film on at least one surface of the polarizer, in which at least one polarizer protective film contains a norbornene-based resin.

(8) An organic electroluminescent device comprising the laminate according to any one of (1) to (7).

(9) A liquid crystal display device comprising the laminate according to any one of (1) to (7).

According to the present invention, it is possible to provide a laminate which has a polarizer and an optically anisotropic layer and is excellent in thermal durability.

Moreover, according to the present invention, it is possible to provide an organic electroluminescent device and a liquid crystal display device, which include the laminate.

DESCRIPTION OF THE PREFERRED EMBODIMENTS

Figure 1:
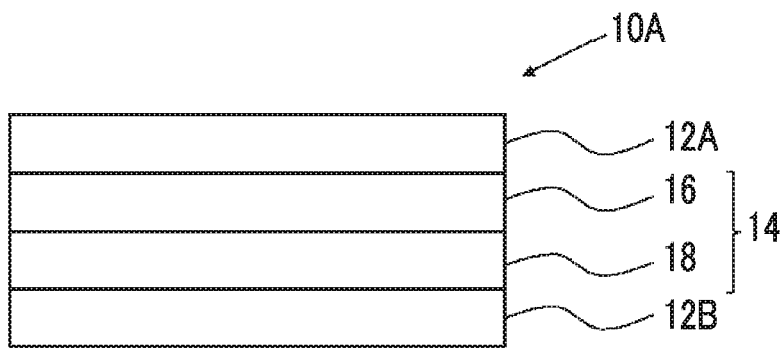
FIG. 1 is a schematic cross-sectional view showing an example of a laminate according to the embodiment of the present invention.

Hereinafter, a laminate, an organic electroluminescent device, and a liquid crystal display device according to an embodiment of the present invention will be described.

Furthermore, in the present specification, a numerical range expressed using "to" means a range that includes the preceding and succeeding numerical values of "to" as the lower limit value and the upper limit value, respectively.

Moreover, "orthogonal" and "parallel" with respect to angles mean a range of a strict angle±10°, and "same" and "different" with respect to the angles can be determined based on whether the difference is less than 5° or not.

Furthermore, in the present specification, "visible light" means light at 380 to 780 nm. In addition, in the present specification, a measurement wavelength is 550 nm unless otherwise specified with respect to the measurement wavelength.

Next, terms used in the present specification will be described.

<Slow Axis>

In the present specification, a "slow axis" means a direction in which the in-plane refractive index is maximum. In addition, the slow axis of the optically anisotropic layer is intended to mean a slow axis of the entire optically anisotropic layer.

<Re($\lambda$) and Rth($\lambda$)>

An in-plane retardation (Re($\lambda$)) and a thickness-direction retardation (Rth($\lambda$)) refer to values measured using AxoScan OPMF-1 (manufactured by Opto Science, Inc.) with a use of light at a measurement wavelength.

Specifically, by inputting an average refractive index ($(nx+ny+nz)/3$) and a film thickness (d ($\mu$m)) to AxoScan OPMF-1, it is possible to calculate:

Slow axis direction (°)

$$Re(\lambda) = R0(\lambda)$$

$$Rth(\lambda) = ((nx+ny)/2 - nz) \times d.$$

In addition, R0($\lambda$) is expressed in a numerical value calculated with AxoScan OPMF-1, and means Re($\lambda$).

Moreover, in the present specification, an A-plate is defined as follows.

The A-plate has two types, that is, a positive A-plate and a negative A-plate, and in a case where a refractive index in a slow axis direction (direction in which the in-plane refractive index is maximum) in a film plane is set as nx, a refractive index in a direction orthogonal to an in-plane slow axis in a plane is set as ny, and a refractive index in the thickness direction is set as nz, the positive A-plate satisfies a relationship of Expression (A1) and the negative A-plate satisfies a relationship of Expression (A2). Moreover, the positive A-plate has Rth of a positive value and the negative A-plate has Rth of a negative value.

$$nx > ny \approx nz \quad \text{Expression (A1)}$$

$$ny < nx \approx nz \quad \text{Expression (A2)}$$

Furthermore, the symbol "$\approx$" encompasses not only a case where the both are completely the same as each other but also a case where the both are substantially the same as each other. For example, "being substantially the same" indicates that a case where (ny−nz)×d (provided that d is a thickness of a film) is −10 to 10 nm and preferably −5 to 5 nm is also included in "ny$\approx$nz", and a case where (nx−nz)×d is −10 to 10 nm and preferably −5 to 5 nm is also included in "nx$\approx$nz".

A C-plate has two types, that is, a positive C-plate and a negative C-plate, the positive C-plate satisfies a relationship of Expression (C1), and the negative C-plate satisfies a relationship of Expression (C2). Moreover, the positive C-plate has Rth of a negative value and the negative C-plate has Rth of a positive value.

$$nz > nx \approx ny \quad \text{Expression (C1)}$$

$$nz < nx \approx ny \quad \text{Expression (C2)}$$

Furthermore, the symbol "$\approx$" encompasses not only a case where the both are completely the same as each other but also a case where the both are substantially the same as each other. For example, "being substantially the same" indicates that a case where (nx−ny)×d (provided that d is a thickness of a film) is 0 to 10 nm and preferably 0 to 5 nm is also included in "nx$\approx$ny".

A feature of the present invention is that a water content of the laminate or the like is adjusted within a predetermined range.

As a result of studies on a cause of the above-mentioned reddish unevenness, the present inventors have found that in a case where the laminate is exposed under the condition of a high temperature, decomposition of a structure derived from a liquid crystal compound in the optically anisotropic layer is rapidly caused after a certain induction period, and variation in the value of the in-plane retardation is increased.

It has been found that the cause of the decomposition as described above is an influence of water. That is, it is considered that in a case where a laminate interposed between two substrates with a low moisture permeability is subjected to a heating treatment, due to the low moisture permeability of the substrates, moisture contained in a polarizer containing a polyvinyl alcohol-based resin is difficult to escape to outside of the substrate and diffuses into an optically anisotropic layer, and the decomposition is induced by the moisture. In particular, it is presumed that the polymerizable liquid crystal compound represented by General Formula (I) may have electron withdrawing properties from the viewpoint of a characteristic such as reciprocal wavelength dispersibility, and as a result, positive polarization of any of carbon atoms constituting the polymerizable liquid crystal compound is increased and the polymerizable liquid crystal compound is more susceptible to attack by a nucleophile.

Furthermore, it is considered that since a substrate is not present on an end surface of the optically anisotropic layer, moisture can diffuse to the outside of the laminate, but since a central portion of the optically anisotropic layer is interposed between two substrates, decomposition is likely to occur, which causes greater variation in the value of the in-plane retardation.

On the other hand, it has been found that in the present invention, by adjusting a moisture content of a laminate itself having an optically anisotropic layer and a polarizer within a predetermined range, even in a case where the laminate is exposed under the condition of a high temperature, decomposition of a liquid crystal compound or the like is suppressed, and as a result, thermal durability of the laminate is excellent.

FIG. 1 shows a schematic cross-sectional view of a laminate according to the embodiment of the present invention. A laminate 10A has a first substrate 12A, a polarizing plate 14, and a second substrate 12B in this order. That is, the polarizing plate 14 is disposed between the first substrate 12A and the second substrate 12B. The polarizing plate 14 has a polarizer 16 and an optically anisotropic layer 18.

Hereinafter, each member will be described in detail.

<Substrate (First Substrate 12A and Second Substrate 12B)>

The laminate has two substrates. In FIG. 1, the two substrates correspond to the first substrate 12A and the second substrate 12B.

A moisture permeability of the substrate is $10^{-3}$ g/m²·day or less. Among them, from the viewpoint of durability of an organic electroluminescent device and a liquid crystal display device to which the laminate is applied, $10^{-3}$ g/m²·day or less is preferable and $10^{-5}$ g/m²·day or less is more preferable. The lower limit is not particularly limited, but is $10^{-10}$ g/m²·day or more in many cases.

The method of measuring the moisture permeability of the substrate is as follows. The measurement is performed using a water vapor permeability measuring device (AQUATRAN 2 (registered trademark) manufactured by MOCON, INC.) under the conditions of a measuring temperature of 40° C. and a relative humidity of 90%.

A material forming the substrate is not particularly limited, and may be an inorganic substance or an organic substance.

The substrate is not particularly limited as long as the substrate has a moisture permeability lower than the regulation, but examples thereof include a glass substrate and a gas barrier film. More specifically, examples thereof include scaling glass used for an organic electroluminescent device, a glass substrate such as glass for a liquid crystal cell and surface cover glass, and a gas barrier film such as a high barrier film and a barrier film used for an organic electroluminescent device.

The substrate may have a single-layered structure or a multi-layer structure.

The substrate is preferably transparent, and is preferably a so-called transparent substrate.

Furthermore, in the present specification, "transparent" indicates that a transmittance of visible light is 60% or more, preferably 80% or more, and more preferably 90% or more. The upper limit is not particularly limited, but is less than 100% in many cases.

A thickness of the substrate is not particularly limited, but is preferably 800 M or less and more preferably 100 μm or less from the viewpoint of reduction in the thickness. The lower limit is not particularly limited, but is preferably 10 μm or more.

<Polarizer>

The laminate has the polarizer. The polarizer is a so-called linear polarizer having a function of converting light into specific linearly polarized light.

The polarizer contains a polyvinyl alcohol-based resin.

The polyvinyl alcohol-based resin is a resin containing a repeating unit of —CH$_2$—CHOH—, and examples thereof include polyvinyl alcohol and an ethylene-vinyl alcohol copolymer.

The polyvinyl alcohol-based resin is obtained, for example, by saponifying a polyvinyl acetate-based resin. Examples of the polyvinyl acetate-based resin include copolymers with other monomers copolymerizable with vinyl acetate, in addition to polyvinyl acetate which is a homopolymer of vinyl acetate.

Examples of the other monomers copolymerizable with vinyl acetate include unsaturated carboxylic acids, olefins, vinyl ethers, unsaturated sulfonic acids, and acrylamides having an ammonium group.

A saponification degree of the polyvinyl alcohol-based resin is not particularly limited, but is preferably 85% to 100% by mole and more preferably 95.0% to 99.95% by mole. The saponification degree can be determined according to JIS K 6726-1994.

An average degree of polymerization of the polyvinyl alcohol-based resin is not particularly limited, but is preferably 100 to 10,000 and more preferably 1,500 to 8,000. Similar to the saponification degree, the average degree of polymerization can be determined according to JIS K 6726-1994.

A content of the polyvinyl alcohol-based resin in the polarizer is not particularly limited, but it is preferable that the polyvinyl alcohol-based resin is contained as a main component in the polarizer. The main component means that the content of the polyvinyl alcohol-based resin is 50% by mass or more with respect to the total mass of the polarizer. The content of the polyvinyl alcohol-based resin is preferably 90% by mass or more with respect to the total mass of the polarizer. The upper limit is not particularly limited, but is 99.9% by mass or less in many cases.

The polarizer preferably further contains a dichroic substance. Examples of the dichroic substance include iodine and an organic dye (dichroic organic dye). That is, it is preferable that the polarizer contains polyvinyl alcohol as a main component and also contains a dichroic substance.

A method for producing the polarizer is not particularly limited, known methods can be mentioned, and examples thereof include a method of adsorbing a dichroic substance to a substrate containing polyvinyl alcohol and stretching the resultant.

A thickness of the polarizer is not particularly limited, but is 20 μm or less in many cases and 15 μm or less in many more cases, and from the viewpoint that the effect of the present invention is superior, the thickness is preferably 10 μm or less, more preferably less than 10 μm, and still more preferably 5 μm or less. The lower limit is not particularly limited, but is 2 μm or more in many cases and 3 μm or more in many more cases. For example, the thickness of the polarizer is preferably 2 to 10 μm.

<Optically Anisotropic Layer>

The laminate has an optically anisotropic layer. The optically anisotropic layer is a layer formed of a composition containing a polymerizable liquid crystal compound represented by General Formula (I).

In the following, first, components in the composition used for forming the optically anisotropic layer will be described in detail, and then a production method and characteristics of the optically anisotropic layer will be described in detail.

(Polymerizable Liquid Crystal Compound Represented by General Formula (I))

The composition contains a polymerizable liquid crystal compound represented by General Formula (I). The polymerizable liquid crystal compound represented by General Formula (I) is a compound exhibiting liquid crystallinity.

$$L_1\text{-}G_1\text{-}D_1\text{-}Ar\text{-}D_2\text{-}G_2\text{-}L_2 \qquad (I)$$

In General Formula (I), $D_1$ and $D_2$ each independently represent a single bond, —O—, —CO—O—, —C(=S) O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—CR$^3$R$^4$—O—CO—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—.

R$^1$, R$^2$, R$^3$, and R$^4$ each independently represent a hydrogen atom, a fluorine atom, or an alkyl group having 1 to 4 carbon atoms. In a case where a plurality of R$^1$, R$^2$, R$^3$, and $R^4$ are present, the plurality of $R^1$, the plurality of $R^2$, the plurality of $R^3$, and the plurality of $R^4$ may be the same as or different from each other.

$G_1$ and $G_2$ each independently represent an alicyclic hydrocarbon group or an aromatic hydrocarbon group, which has 5 to 8 carbon atoms and is divalent, and a methylene group contained in the alicyclic hydrocarbon group may be substituted with —O—, —S—, or —NH—.

$L_1$ and $L_2$ each independently represent a monovalent organic group, and at least one selected from the group consisting of $L_1$ and $L_2$ represents a monovalent group having a polymerizable group.

Ar represents a divalent aromatic ring group represented by General Formula (II-1), General Formula (II-2), General Formula (II-3), or General Formula (II-4).

General Formulae

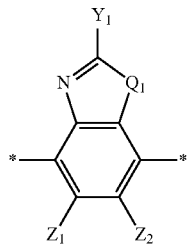

(II-1)

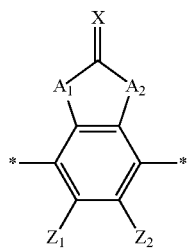

(II-2)

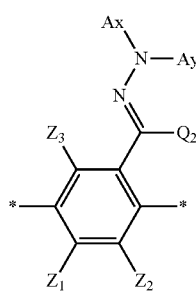

(II-3)

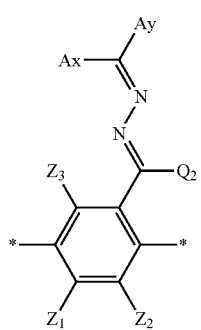

(II-4)

In General Formulae (II-1) to (II-4), $Q_1$ represents —S—, —O—, or —NR$^{11}$—, $R^{11}$ represents a hydrogen atom or an alkyl group having 1 to 6 carbon atoms, $Y_1$ represents an aromatic hydrocarbon group having 6 to 12 carbon atoms or an aromatic heterocyclic group having 3 to 12 carbon atoms (furthermore, the aromatic hydrocarbon group and the aromatic heterocyclic group each may each have a substituent), $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —NR$^{12}$R$^{13}$, or —SR$^{12}$, $Z_1$ and $Z_2$ may be bonded to each other to form an aromatic ring or an aromatic heterocyclic ring, and $R^{12}$ and $R^{13}$ each independently represent a hydrogen atom or an alkyl group having 1 to 6 carbon atoms, $A_1$ and $A_2$ are each independently a group selected from the group consisting of —O—, —NR$^{21}$—, —S—, and —CO—, in which $R^{21}$ represents a hydrogen atom or a substituent, and X represents a hydrogen atom or a non-metallic atom (preferred examples thereof include =O, =S, =NR', and =C(R')R'(in which R' represents a substituent)) of Groups 14 to 16, to which a substituent may be bonded, Ax represents an organic group having 2 to 30 carbon atoms and having at least one aromatic ring selected from the group consisting of an aromatic hydrocarbon ring and an aromatic heterocyclic ring, and preferred examples thereof include an aromatic hydrocarbon ring group; an aromatic heterocyclic group; and an alkyl group having 3 to 20 carbon atoms and having at least one aromatic ring selected from the group consisting of an aromatic hydrocarbon ring and an aromatic heterocyclic ring, Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring, and suitable aspects of this organic group are the same as the suitable aspects of the organic group of Ax, the aromatic rings in Ax and Ay may each have a substituent, and Ax and Ay may be bonded to each other to form a ring, and $Q_2$ represents a hydrogen atom or an alkyl group having 1 to 6 carbon atoms, which may have a substituent.

Furthermore, examples of the substituent include a halogen atom, an alkyl group, a halogenated alkyl group, an alkenyl group, an aryl group, a cyano group, an amino group, a nitro group, a nitroso group, a carboxy group, an alkylsulfinyl group having 1 to 6 carbon atoms, an alkylsulfonyl group having 1 to 6 carbon atoms, a fluoroalkyl group having 1 to 6 carbon atoms, an alkoxy group having 1 to 6 carbon atoms, an alkylsulfanyl group having 1 to 6 carbon atoms, an N-alkylamino group having 1 to 6 carbon atoms, an N,N-dialkylamino group having 2 to 12 carbon atoms, an N-alkylsulfamoyl group having 1 to 6 carbon atoms, an N,N-dialkylsulfamoyl group having 2 to 12 carbon atoms, or a group which is a combination thereof.

For the definition and the preferred range of each substituent of the liquid crystal compound represented by General Formula (I), reference can be made to the description on $D^1$, $D^2$, $G^1$, $G^2$, $L^1$, $L^2$, $R^4$, $R^5$, $R^6$, $R^7$, $X^1$, $Y^1$, $Q^1$, and $Q^2$ for the compound (A) described in JP2012-021068A with regard to $D_1$, $D_2$, $G_1$, $G_2$, $L_1$, $L_2$, $R^1$, $R^2$, $R^3$, $R^4$, $Q_1$, $Y_1$, $Z_1$, and $Z_2$, respectively; reference can be made to the description on $A_1$, $A_2$, and X for the compound represented by General Formula (I) described in JP2008-107767A with regard to $A_1$, $A_2$, and X, respectively; and reference can be made to the description on Ax, Ay, and $Q^1$ for the compound represented by General Formula (I) described in WO2013/018526A with regard to Ax, Ay, and $Q_2$, respectively. Reference can be made to the description on $Q^1$ for the compound (A) described in JP2012-021068A with regard to $Z_3$.

In particular, the organic groups represented by $L_1$ and $L_2$ are each particularly preferably a group represented by -$D_3$-$G_3$-Sp-$P_3$.

D has the same meaning as $D_1$.

$G_3$ represents a single bond, an aromatic ring group or a heterocyclic group, which has 6 to 12 carbon atoms and is divalent, or a divalent alicyclic hydrocarbon group having 5 to 8 carbon atoms, and a methylene group included in the alicyclic hydrocarbon group may be substituted with —O—, —S—, or —$NR^7$—, in which $R^7$ represents a hydrogen atom or an alkyl group having 1 to 6 carbon atoms.

Sp represents a single bond, or a spacer group represented by —$(CH_2)_n$—, —$(CH_2)_n$—O—, —$(CH_2$—O—$)_n$—, —$(CH_2CH_2$—O—$)_n$, —O—$(CH_2)_n$—, —O—$(CH_2)_n$—O—, —O—$(CH_2$—O—$)_n$—, —O—$(CH_2CH_2$—O—$)_m$, —C(=O)—O—$(CH_2)_n$—, —C(=O)—O—$(CH_2)_n$—O—, —C(=O)—O—$(CH_2$—O—$)_n$—, —C(=O)—O—$(CH_2CH_2$—O—$)_m$, —C(=O)—$N(R^8)$—$(CH_2)_n$—, —C(=O)—$N(R_8)$—$(CH_2)_n$—O—, —C(=O)—$N(R_8)$—$(CH_2$—O—$)_n$—, —C(=O)—$N(R^8)$—$(CH_2CH_2$—O—$)_m$, or —$(CH_2)_n$—O—(C=O)—$(CH_2)_n$—C(=O)—O—$(CH_2)_n$—. Here, n represents an integer of 2 to 12, m represents an integer of 2 to 6, and $R^8$ represents a hydrogen atom or an alkyl group having 1 to 6 carbon atoms. Moreover, the hydrogen atom of —$CH_2$— in each of the above groups may be substituted with a methyl group.

$P_3$ represents a polymerizable group.

The polymerizable group is not particularly limited, but is preferably a polymerizable group capable of radical polymerization or cationic polymerization.

As a radically polymerizable group, known radically polymerizable groups are mentioned, and an acryloyl group or a methacryloyl group is preferable. It is known that the acryloyl group generally has a high polymerization rate, and from the viewpoint of improvement in productivity, the acryloyl group is preferable but the methacryloyl group can also be used in the same manner as the polymerizable group of a high birefringence liquid crystal.

As a cationically polymerizable group, known cationically polymerizable groups are mentioned, and examples thereof include an alicyclic ether group, a cyclic acetal group, a cyclic lactone group, a cyclic thioether group, a spiroorthoester group, and a vinyloxy group. Among them, an alicyclic ether group or a vinyloxy group is preferable, and an epoxy group, an oxetanyl group, or a vinyloxy group is more preferable.

Particularly preferred examples of the polymerizable group include the following groups.

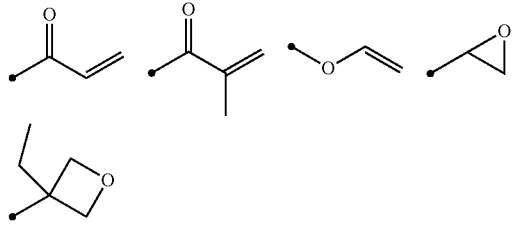

Furthermore, in the present specification, the "alkyl group" may be any one of linear, branched, or cyclic, and examples thereof include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a 1,1-dimethylpropyl group, an n-hexyl group, an isohexyl group, a cyclopropyl group, a cyclobutyl group, a cyclopentyl group, and a cyclohexyl group.

Preferred examples of the liquid crystal compound represented by General Formula (I) are shown below, but are not limited to these liquid crystal compounds.

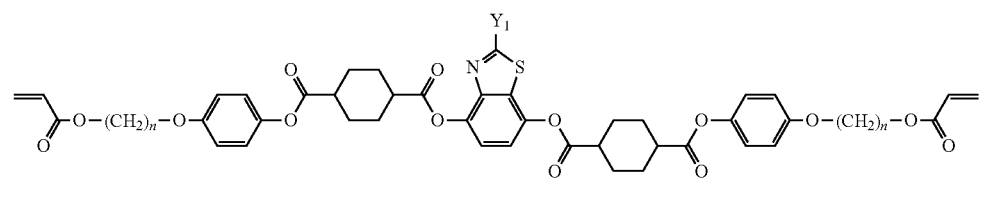

| No | Y1 | n |
|---|---|---|
| II-1-1 | 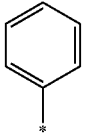 | 6 |
| II-1-2 | 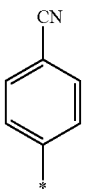 CN | 6 |

-continued
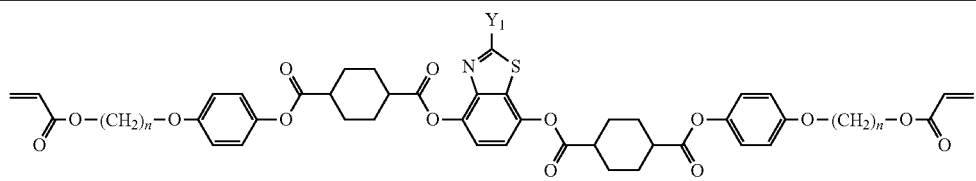
| No | Y1 | n |
|---|---|---|
| II-1-3 | 4-nitrophenyl | 6 |
| II-1-4 | 4-pyridyl | 6 |
| II-1-5 | 4-(styryl)phenyl | 6 |
| II-1-6 | 4-nitrophenyl | 11 |
| II-1-7 | 4-nitrophenyl | 8 |
| II-1-8 | 4-nitrophenyl | 4 |

-continued
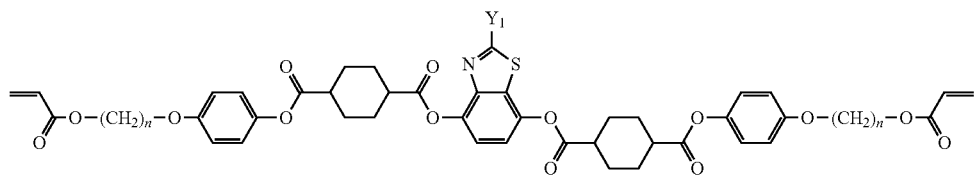
| No | Y1 | n |
|---|---|---|
| II-1-9 | thiophen-2-yl | 6 |
| II-1-10 | 3-methyl-4-nitrophenyl | 6 |
| II-1-11 | 4,6-dimethylbenzofuran-2-yl | 6 |
| II-1-12 | furan-2-yl | 6 |
| II-1-13 | 5-chlorothiophen-2-yl | 6 |
| II-1-14 | thiazol-5-yl | 6 |
| II-1-15 | 4-(methylsulfonyl)phenyl | 6 |

II-1-16
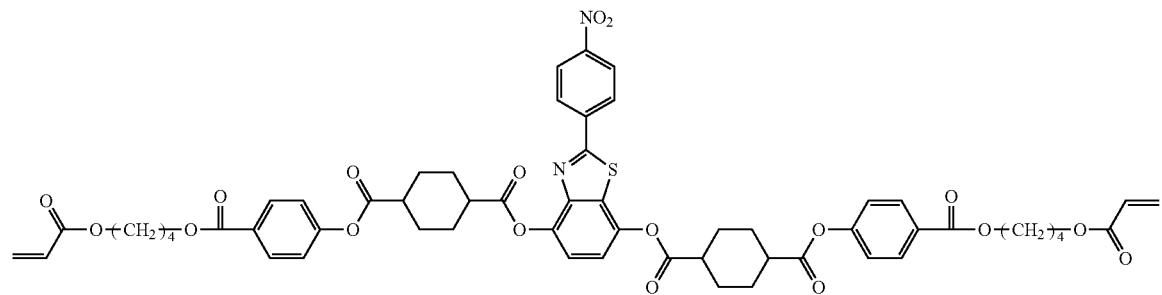
II-1-17
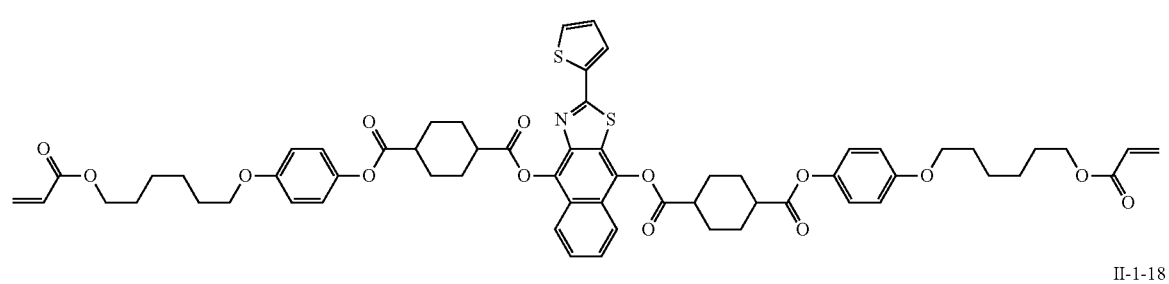
II-1-18
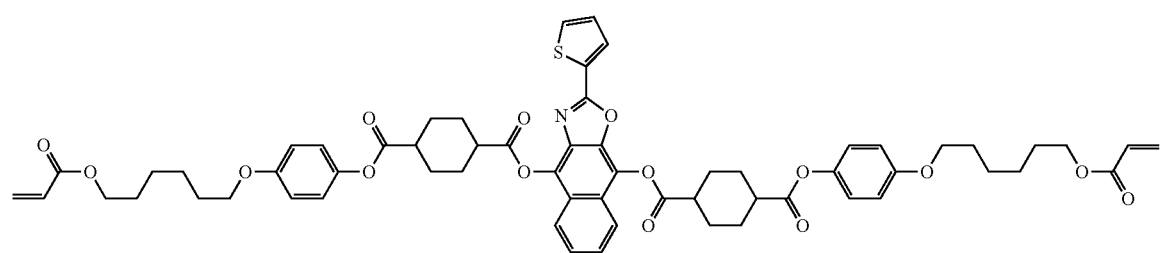
| No | X | R1 |
|---|---|---|
| II-2-1 | NC−CH(*)−CN | H |
| II-2-2 | NC−CH(*)−C(O)OCH₃ | H |
| II-2-3 | NC−CH(*)−C(O)O−butyl | H |
| II-2-4 | NC−CH(*)−C(O)O−CH₂CH₂−O−C(CH₃)₂−OH | H |

-continued

| No | X | R1 |
|---|---|---|
| II-2-5 | NC-C(*)-CN | CH₃ |
| II-2-6 | NC-C(*)-CN | C(CH₃)₃ |
| II-2-7 | S | H |

Incidentally, in the formulae, "*" represents a bonding position.

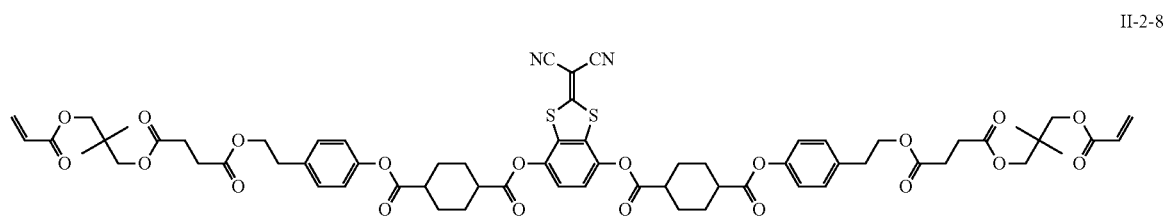

II-2-8

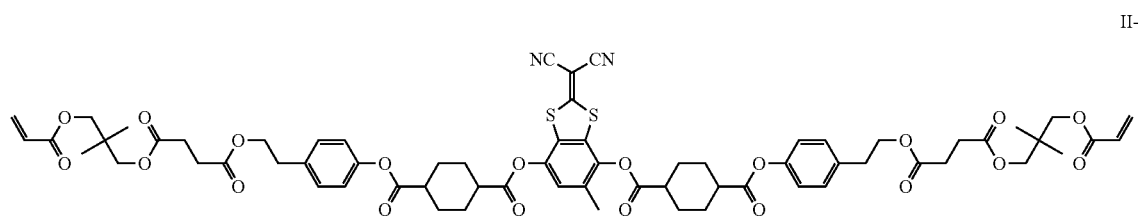

II-2-9

In addition, the group adjacent to the acryloyloxy group in Formulae II-2-8 and II-2-9 represents a propylene group (a group in which a methyl group is substituted with an ethylene group), and represents a mixture of positional isomers having different positions of a methyl group.

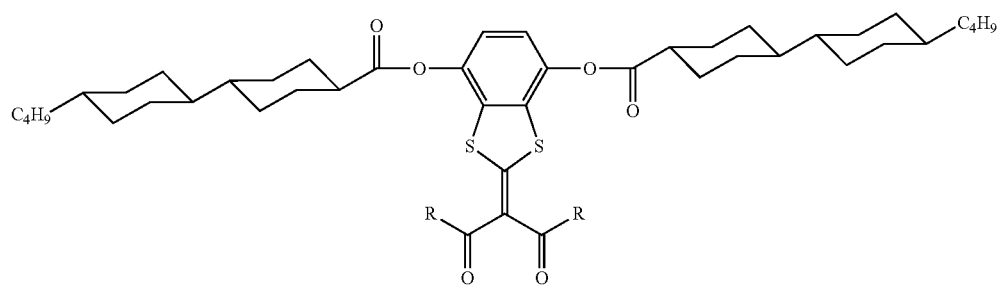

-continued
(10) R = 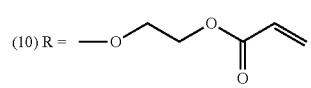
(11) R = 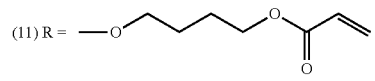
(12) R = 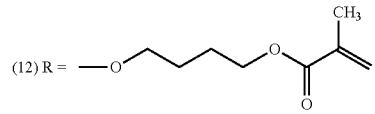
(13) R = 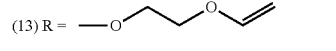
(14) R = 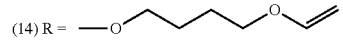
(15) R = 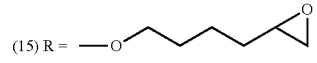
(16) R = 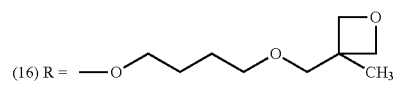
(17) R = 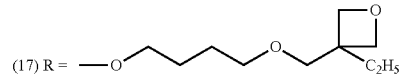
(18) R = 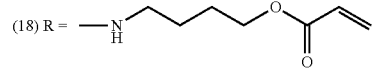
(19) R = 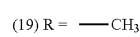  —CH₃
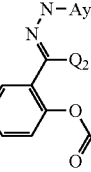
| No | Ax | Ay | Q2 |
|---|---|---|---|
| II-3-1 | benzothiazol-2-yl | H | H |
| II-3-2 | benzoxazol-2-yl | H | H |
| II-3-3 | naphthalen-1-yl | H | H |
| II-3-4 | Ph | Ph | H |
| II-3-5 | quinolin-2-yl | H | H |
| II-3-6 | phthalazin-1-yl | H | H |
| II-3-7 | benzothiazol-2-yl | CH₃ | H |
| II-3-8 | benzothiazol-2-yl | C₄H₉ | H |

-continued

| No | Ax | Ay | Q2 |
|---|---|---|---|
| II-3-9 | benzothiazol-2-yl | C₆H₁₃ | H |
| II-3-10 | benzothiazol-2-yl | CH₂=CH-C(=O)-* | H |
| II-3-11 | benzothiazol-2-yl | benzothiazol-2-yl | H |
| II-3-12 | benzothiazol-2-yl | CH₂CN | H |
| II-3-13 | benzothiazol-2-yl | cyclohexyl | H |
| II-3-14 | benzothiazol-2-yl | isobutyl (*-CH₂CH(CH₃)CH₃) | H |
| II-3-15 | benzothiazol-2-yl | CH₂CH₂OH | H |
| II-3-16 | 9H-fluoren-9-yl | H | H |
| II-3-17 | benzothiazol-2-yl | CH₂CF₃ | H |
| II-3-18 | benzothiazol-2-yl | H | CH₃ |
| II-3-19 | benzothiazol-2-yl | cyclohexylmethyl | H |

-continued
| No | Ax | Ay | Q2 |
|---|---|---|---|
| II-3-20 | benzothiazol-2-yl | *-CH₂CH₂-CN | H |
| II-3-21 | benzothiazol-2-yl | *-CH₂-C₆H₅ | H |
| II-3-22 | benzothiazol-2-yl | *-SO₂-C₆H₄-CH₃ | H |
| II-3-23 | benzothiazol-2-yl | *-CH₂OCH₂CH₂OCH₃ | H |
| II-3-24 | benzothiazol-2-yl | *-C(O)-CH₂CH₂CH₃ | H |
| II-3-25 | naphtho[1,2-d]thiazol-2-yl | C₆H₁₃ | H |
II-3-26
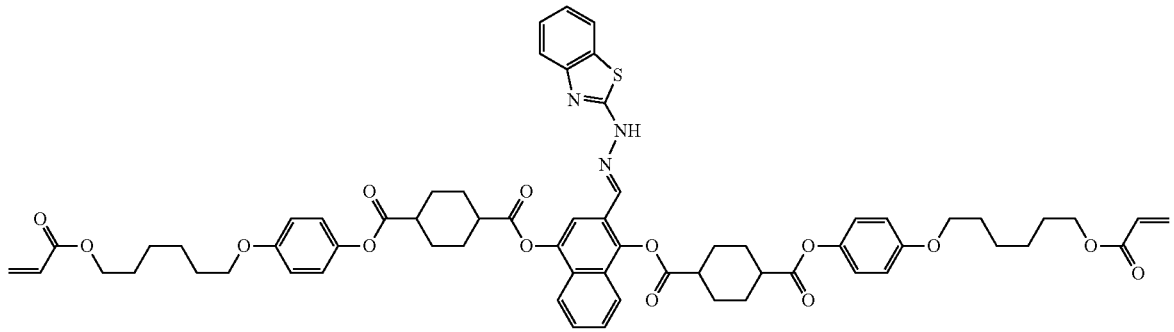

-continued
II-3-27
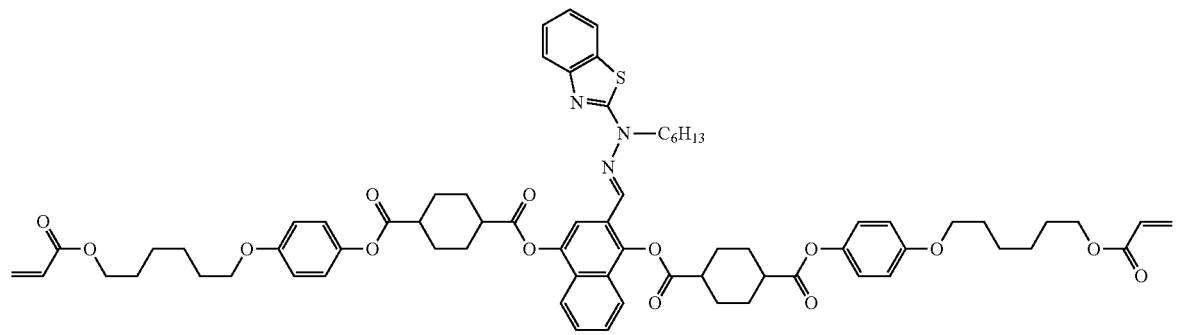
II-3-28
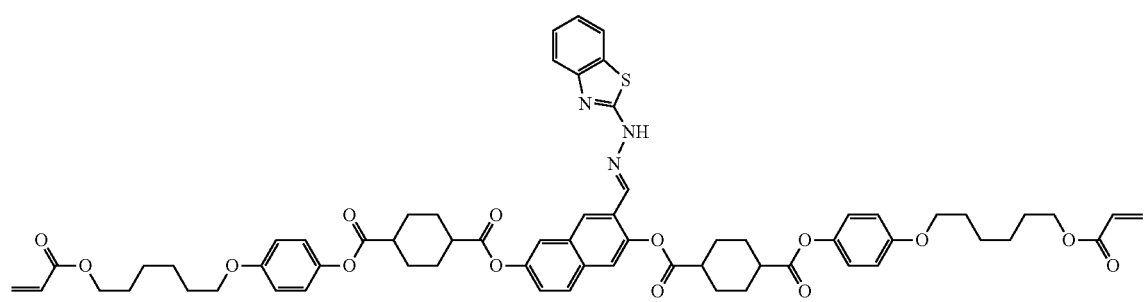
II-3-29
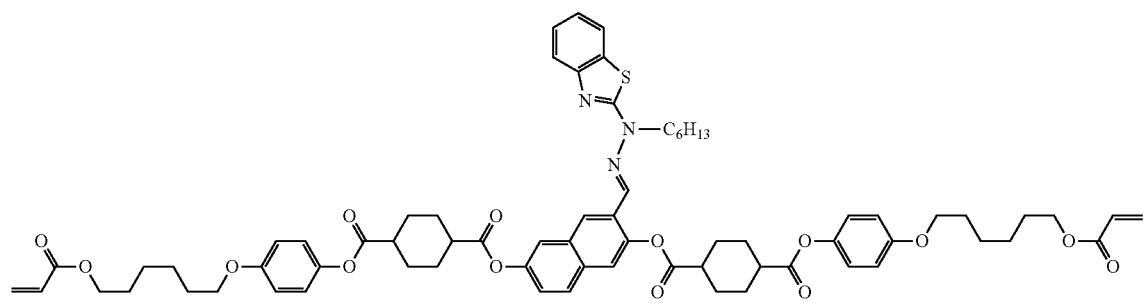
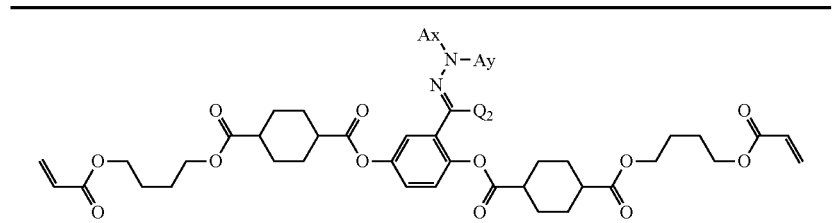
| No | Ax | Ay | Q2 |
|---|---|---|---|
| II-3-30 | 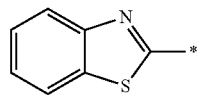 | H | H |
| II-3-31 | 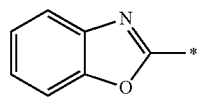 | H | H |

-continued
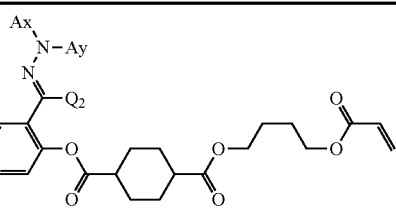
| No | Ax | Ay | Q2 |
|---|---|---|---|
| II-3-32 | 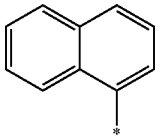 | H | H |
| II-3-33 | Ph | Ph | H |
| II-3-34 | 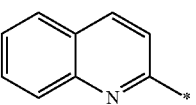 | H | H |
| II-3-35 | 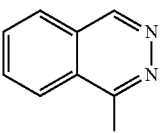 | H | H |
| II-3-36 | 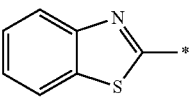 | CH$_3$ | H |
| II-3-37 | 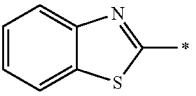 | C$_4$H$_9$ | H |
| II-3-38 | 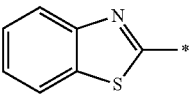 | C$_6$H$_{13}$ | H |
| II-3-39 | 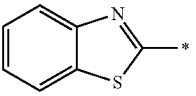 | 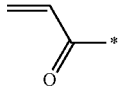 | H |
| II-3-40 | 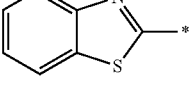 | 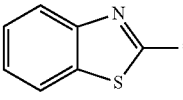 | H |
| II-3-41 | 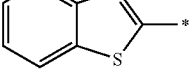 | CH$_2$CN | H |
| II-3-42 | 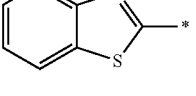 | 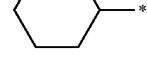 | H |
| II-3-43 | 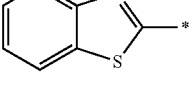 | 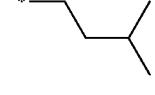 | H |

-continued
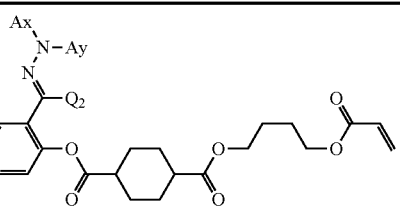
| No | Ax | Ay | Q2 |
|---|---|---|---|
| II-3-46 | 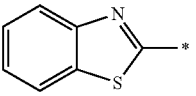 | CH$_2$CH$_2$OH | H |
| II-3-45 | 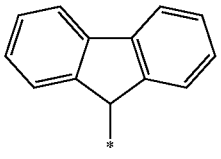 | H | H |
| II-3-46 | 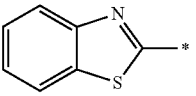 | CH$_2$CF$_3$ | H |
| II-3-47 | 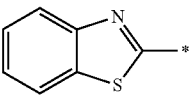 | H | CH$_3$ |
| II-3-48 | 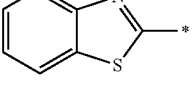 | 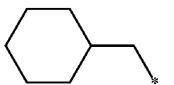 | H |
| II-3-49 | 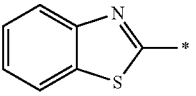 | 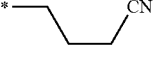 | H |
| II-3-50 | 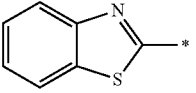 | 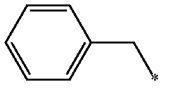 | H |
| II-3-51 | 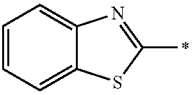 | 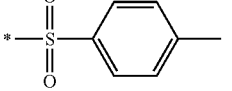 | H |
| II-3-52 | 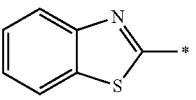 | 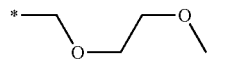 | H |
| II-3-53 | 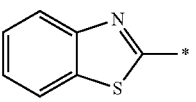 | 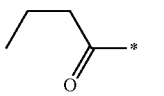 | H |
| II-3-54 | 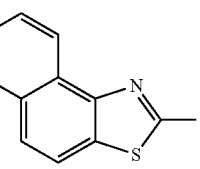 | C$_6$H$_{13}$ | H |

II-3-55
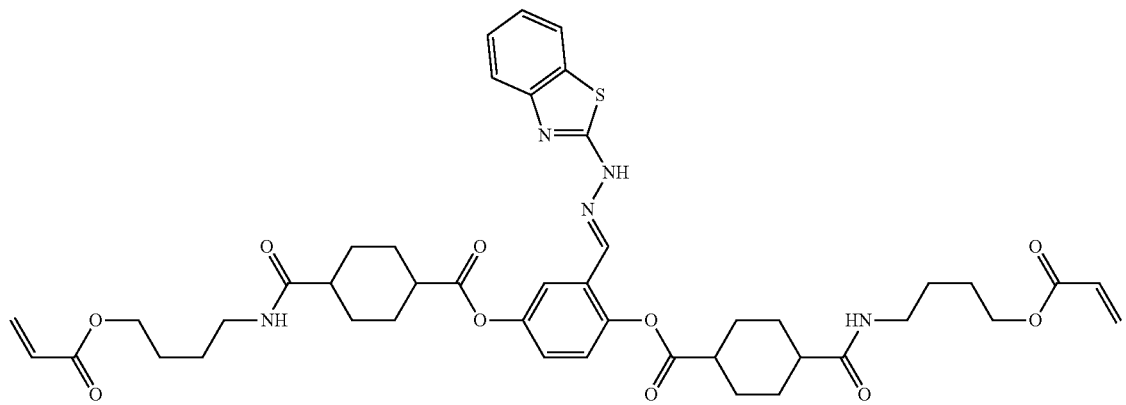
II-4-1
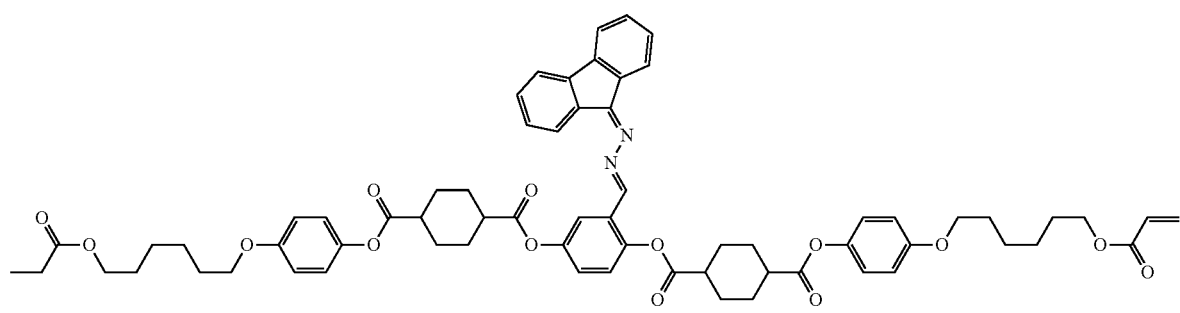
II-4-2
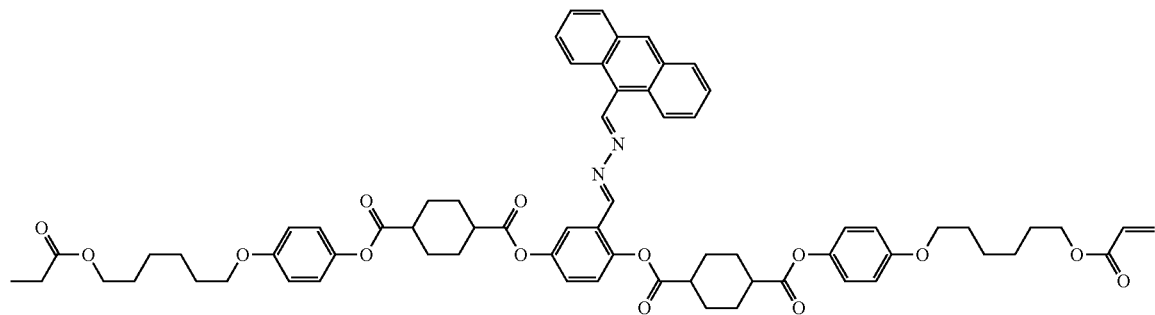
II-4-3
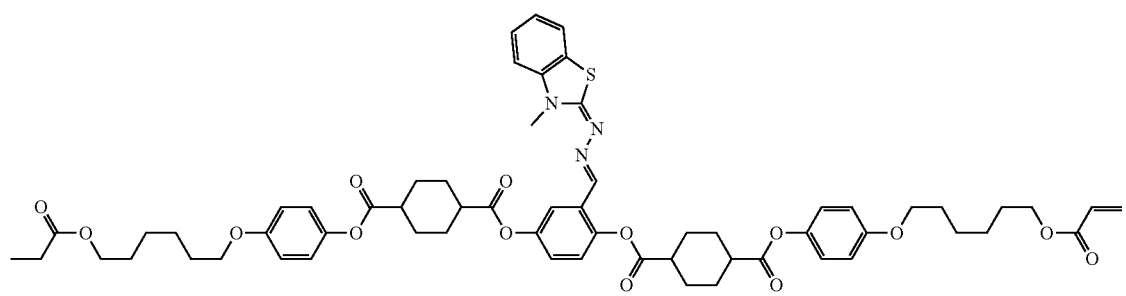

-continued
III-1-1
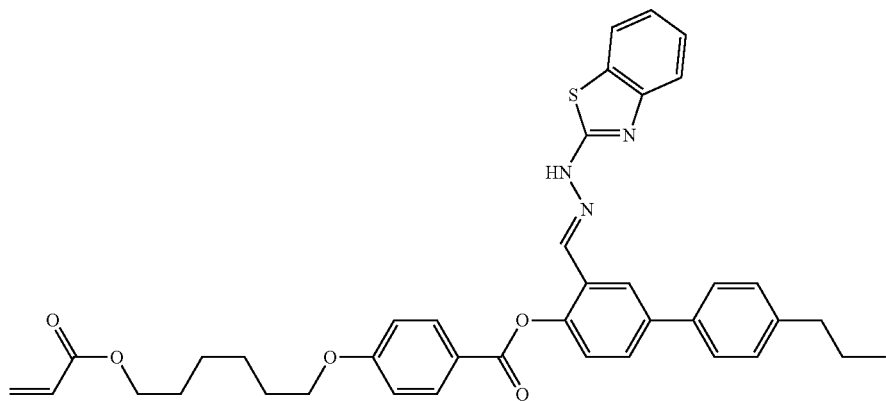
III-1-2
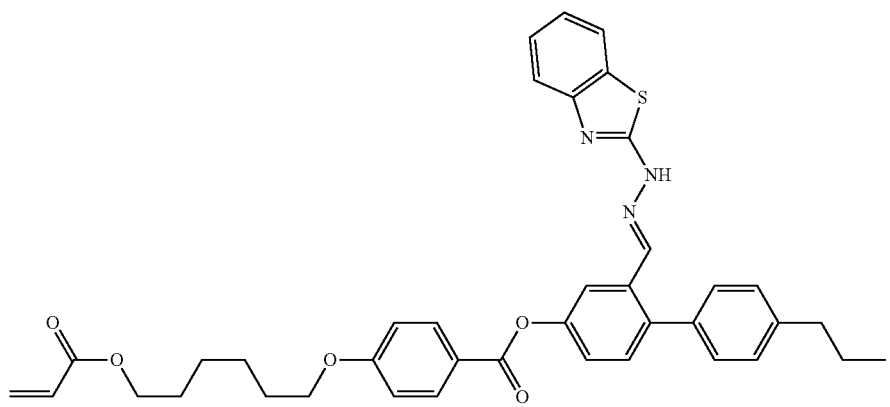
III-2-1
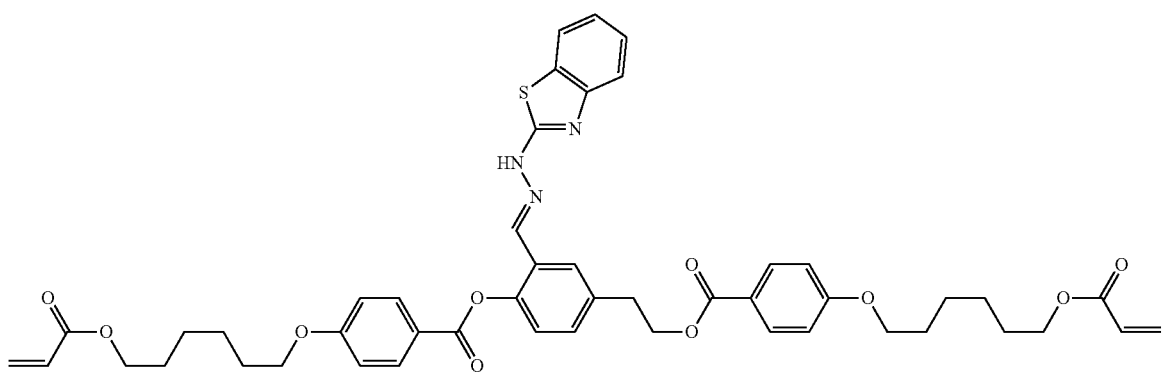
III-2-2
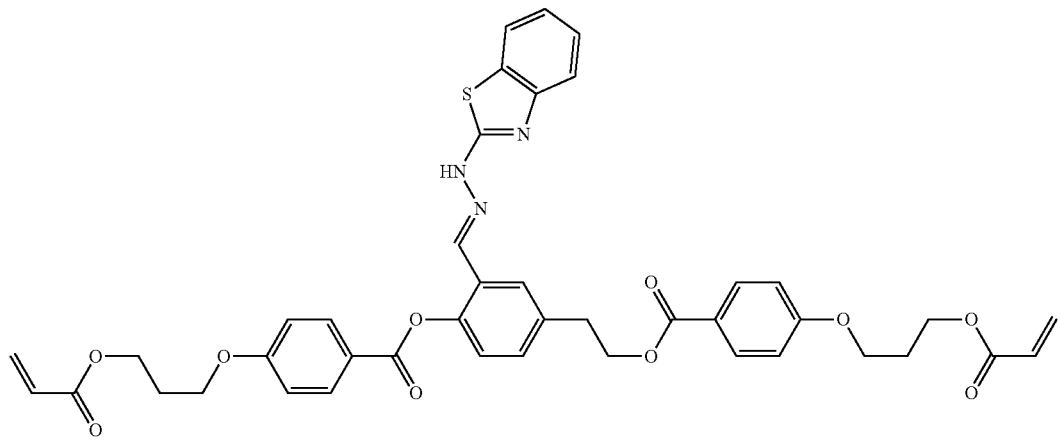

-continued
III-2-3
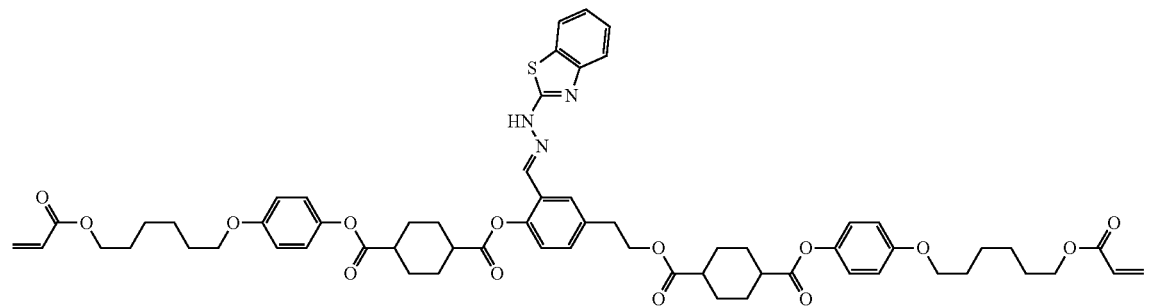
III-3-1
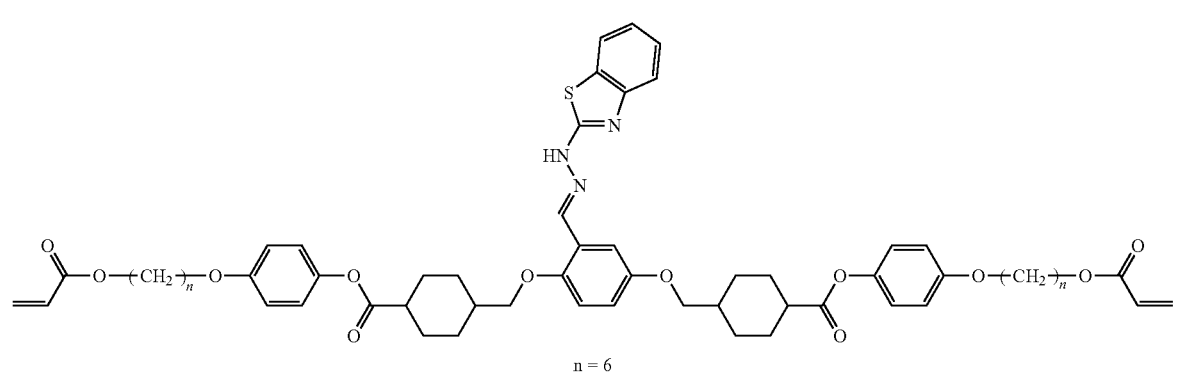
n = 6
III-3-2
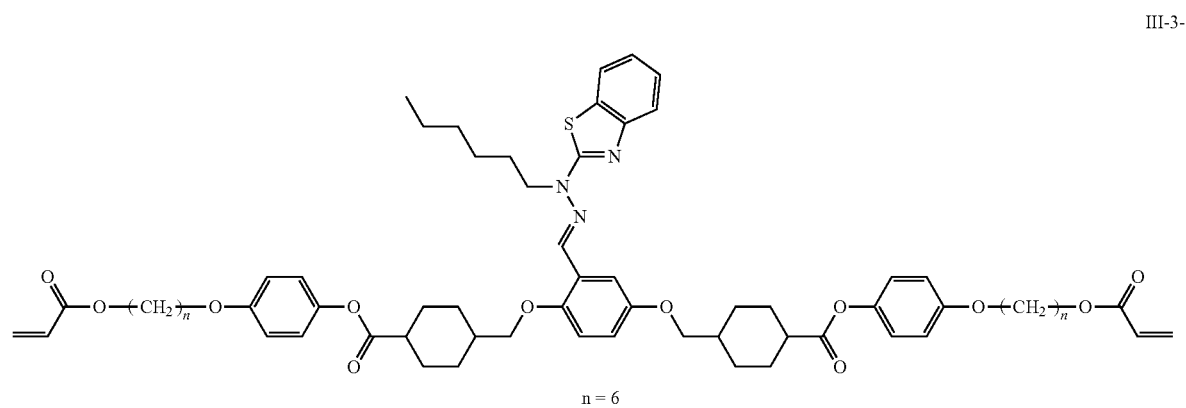
n = 6
III-3-3
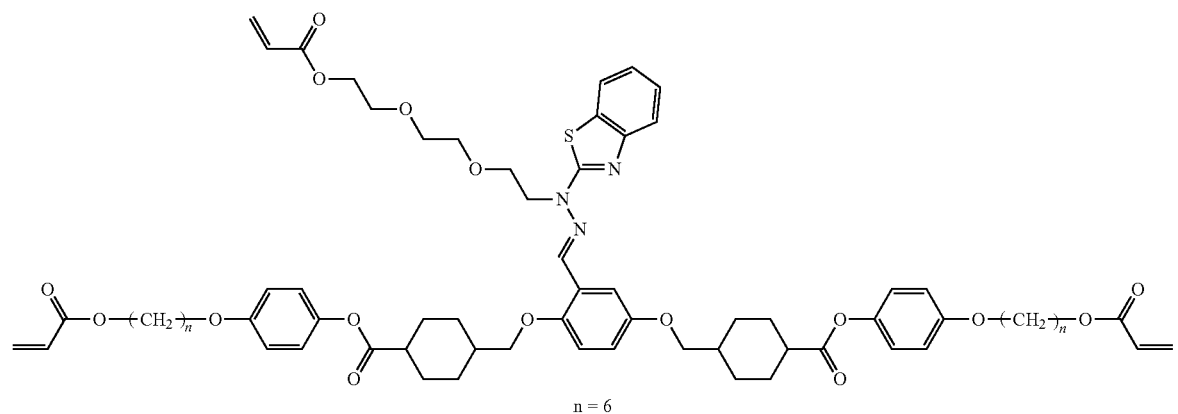
n = 6

III-3-4

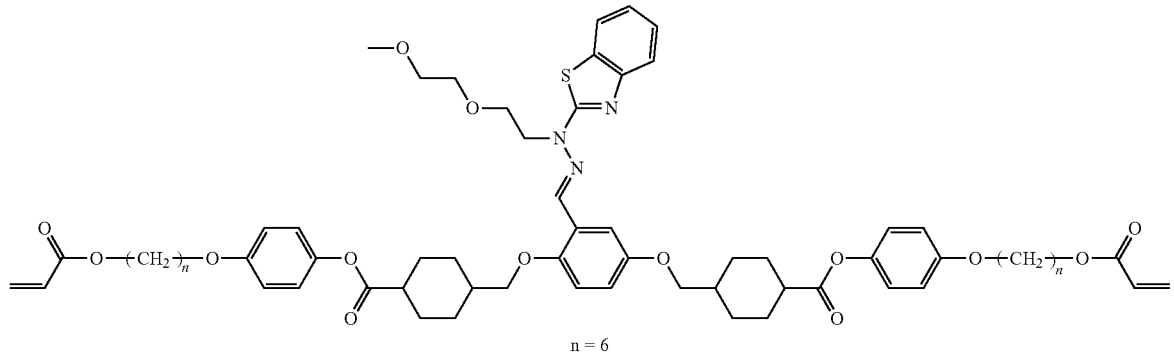

n = 6

A content of the polymerizable liquid crystal compound represented by General Formula (I) in the composition is not particularly limited, but is preferably 50% to 100% by mass and more preferably 70% to 99% by mass with respect to the total solid content in the composition.

The solid content means other components excluding a solvent in the composition, and the other components are calculated as the solid content even in a case where a property of the component is a liquid.

The composition may contain another liquid crystal compound in addition to the polymerizable liquid crystal compound represented by General Formula (I). As the other liquid crystal compound, known liquid crystal compounds (a rod-shaped liquid crystal compound and a disk-shaped liquid crystal compound) are mentioned. The other liquid crystal compound may have a polymerizable group.

A content of the other liquid crystal compound in the composition is preferably 0% to 50% by mass and more preferably 10% to 40% by mass with respect to the total mass of the polymerizable liquid crystal compound represented by General Formula (I).

As the other liquid crystal compound, a liquid crystal compound partially having a cyclohexane ring in which one hydrogen atom is substituted with a linear alkyl group is preferable.

Here, the "cyclohexane ring in which one hydrogen atom is substituted with a linear alkyl group" refers to a cyclohexane ring in which one hydrogen atom of the cyclohexane ring present on a terminal side of a molecule is substituted with a linear alkyl group, for example, in a case where the compound has two cyclohexane rings as shown in General Formula (2).

Examples of the compound include compounds having a structure represented by General Formula (2), and among them, from the viewpoint that a laminate having excellent thermal durability is obtained, a compound represented by General Formula (3), which has a (meth)acryloyl group, is preferable.

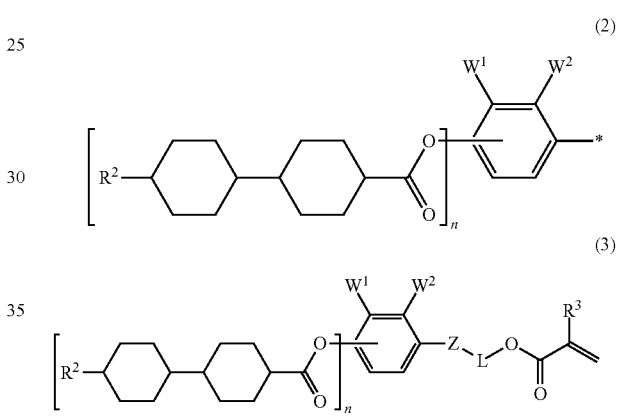

In General Formula (2), * represents a bonding position.

In addition, in General Formulae (2) and (3), $R^2$ represents an alkyl group having 1 to 10 carbon atoms, n represents 1 or 2, $W^1$ and $W^2$ each independently represent an alkyl group, an alkoxy group, or a halogen atom, and $W^1$ and $W^2$ may be bonded to each other to form a ring structure which may have a substituent.

Furthermore, in General Formula (3), Z represents —COO—, L represents an alkylene group having 1 to 6 carbon atoms, and $R^3$ represents a hydrogen atom or a methyl group.

Examples of the compound include compounds represented by Formulae A-1 to A-5. Moreover, in Formula A-3, $R^4$ represents an ethyl group or a butyl group.

A-1

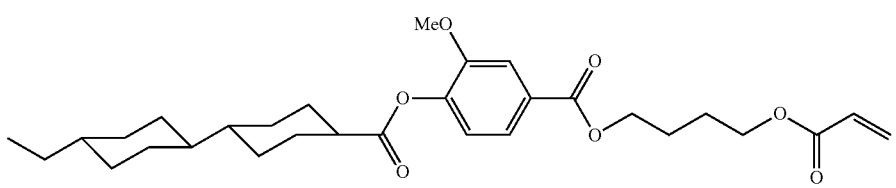

-continued

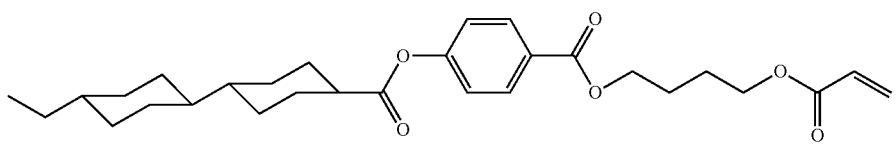
A-2

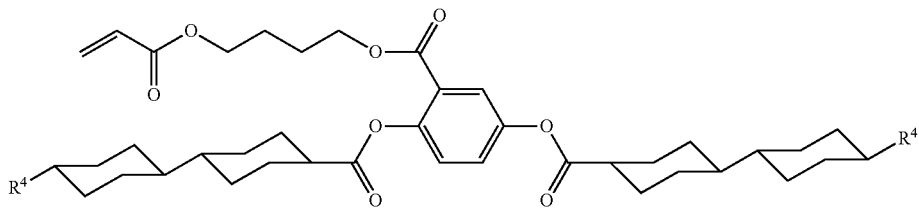
A-3

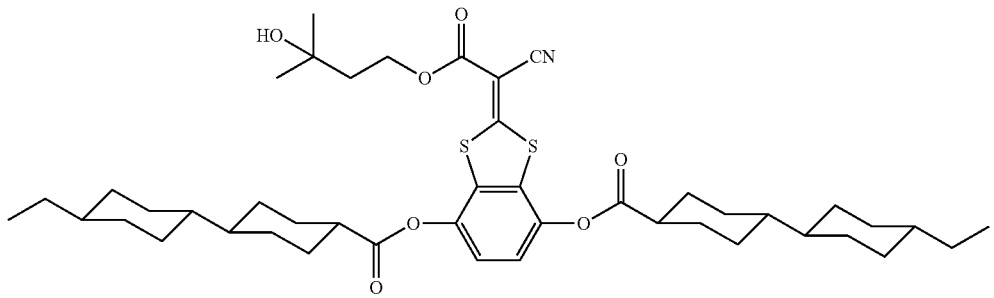
A-4

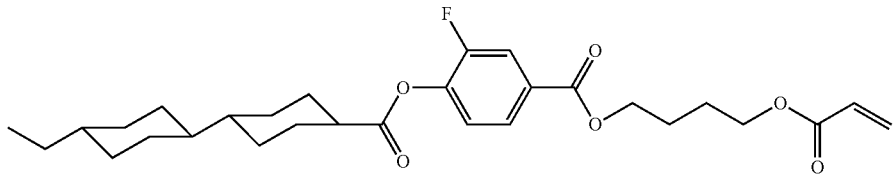
A-5

Examples of the other liquid crystal compound include the compound represented by Formula (M1), (M2), or (M3) described in paragraphs [0030] to [0033] of JP2014-077068A.

(Polymerizable Monomer)

The composition may contain other polymerizable monomers in addition to the polymerizable liquid crystal compound represented by General Formula (I) and the other liquid crystal compound having a polymerizable group. Among them, from the viewpoint that hardness of the optically anisotropic layer is superior, a polymerizable compound (polyfunctional polymerizable monomer) having two or more polymerizable groups is preferable.

As the polyfunctional polymerizable monomer, a polyfunctional radically polymerizable monomer is preferable. Examples of the polyfunctional radically polymerizable monomer include the polymerizable monomers described in paragraphs [0018] to [0020] of JP2002-296423A.

Furthermore, in a case where the composition contains the polyfunctional polymerizable monomer, a content of the polyfunctional polymerizable monomer is preferably 0.1% to 20% by mass, more preferably 0.1% to 10% by mass, and still more preferably 0.1% to 5% by mass with respect to the total solid content in the composition.

(Polymerization Initiator)

The composition may contain a polymerization initiator.

The polymerization initiator is preferably a photopolymerization initiator capable of initiating a polymerization reaction upon irradiation with ultraviolet rays.

Examples of the photopolymerization initiator include α-carbonyl compounds (described in each of the specifications of U.S. Pat. Nos. 2,367,661A and 2,367,670A), acyloin ether (described in the specification of U.S. Pat. No. 2,448,828A), α-hydrocarbon-substituted aromatic acyloin compounds (described in the specification of U.S. Pat. No. 2,722,512A), polynuclear quinone compounds (described in each of the specifications of U.S. Pat. Nos. 3,046,127A and 2,951,758A), combinations of a triarylimidazole dimer and p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

As the polymerization initiator, an oxime-type polymerization initiator is preferable and a compound represented by General Formula (2) is more preferable.

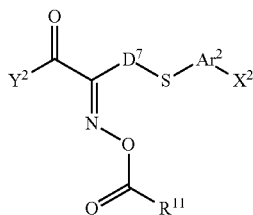

(2)

In General Formula (2), $X^2$ represents a hydrogen atom or a halogen atom.

Moreover, in General Formula (2), $Ar^2$ represents a divalent aromatic group, and $D^7$ represents a divalent organic group having 1 to 12 carbon atoms.

Furthermore, in General Formula (2), $R^{11}$ represents an alkyl group having 1 to 12 carbon atoms, and $Y^2$ represents a monovalent organic group.

In General Formula (2), examples of the halogen atom represented by $X^2$ include a fluorine atom, a chlorine atom, a bromine atom, and an iodine atom, and a chlorine atom is preferable.

Furthermore, in General Formula (2), examples of the divalent aromatic group represented by $Ar^2$ include a divalent group having an aromatic hydrocarbon ring such as a benzene ring, a naphthalene ring, an anthracene ring, and a phenanthroline ring, or an aromatic heterocyclic ring such as a furan ring, a pyrrole ring, a thiophene ring, a pyridine ring, a thiazole ring, and a benzothiazole ring.

Incidentally, in General Formula (2), examples of the divalent organic group having 1 to 12 carbon atoms, which is represented by $D^7$, include a linear or branched alkylene group having 1 to 12 carbon atoms, and specific examples thereof include a methylene group, an ethylene group, and a propylene group.

Moreover, in General Formula (2), examples of the alkyl group having 1 to 12 carbon atoms, which is represented by $R^{11}$, include a methyl group, an ethyl group, and a propyl group.

In addition, in General Formula (2), examples of the monovalent organic group represented by $Y^2$ include a functional group including a benzophenone skeleton $((C_6H_5)_2CO)$. Specifically, as in the groups represented by General Formula (2a) and General Formula (2b), a functional group including a benzophenone skeleton in which a benzene ring at a terminal is unsubstituted or mono-substituted is preferable. Moreover, in General Formula (2a) and General Formula (2b), * represents a bonding position, that is, a bonding position to the carbon atom of the carbonyl group in General Formula (2).

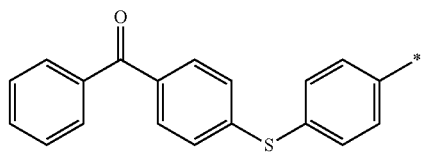

(2a)

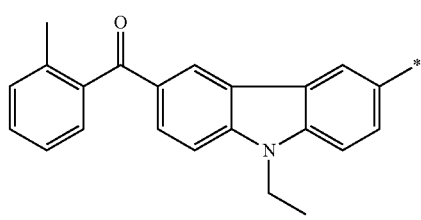

(2b)

Examples of the compound represented by General Formula (2) include a compound represented by Formula S-1 and a compound represented by Formula S-2.

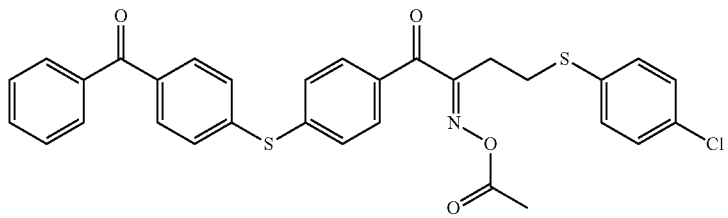

S-1

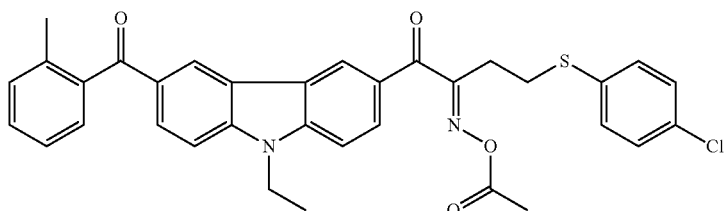

S-2

A content of the polymerization initiator in the composition is not particularly limited, but is preferably 0.01% to 20% by mass and more preferably 0.5% to 5% by mass with respect to the total solid content in the composition.

(Solvent)

The composition may contain a solvent from the viewpoints of workability for forming the optically anisotropic layer.

Examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halocarbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

These solvents may be used alone or in combination of two or more thereof.

(Leveling Agent)

The composition may contain a leveling agent from the viewpoint that the surface of the optically anisotropic layer is kept smooth.

As the leveling agent, for a reason of a high leveling effect on the addition amount, a fluorine-based leveling agent or a silicon-based leveling agent is preferable, and from the viewpoint that weeping (bloom or bleed) is less likely to be caused, a fluorine-based leveling agent is more preferable.

Examples of the leveling agent include the compound described in paragraphs [0079] to [0102] of JP2007-069471A, the polymerizable liquid crystal compound (particularly, the compound described in paragraphs [0020] to [0032]) represented by General Formula (I), which is described in JP2013-047204A, the polymerizable liquid crystal compound (particularly, the compound described in paragraphs [0022] to [0029]) represented by General Formula (I), which is described in JP2012-211306A, the liquid crystal alignment promoter (particularly, the compound described in paragraphs [0076] to [0078] and paragraphs [0082] to [0084]) represented by General Formula (I), which is described in JP2002-129162A, and the compounds (particularly, the compounds described in paragraphs [0092] to [0096]) represented by General Formulae (I), (II), and (III), which is described in JP2005-099248A. Furthermore, the leveling agent may also have a function as an alignment control agent described later.

(Alignment Control Agent)

The composition may contain an alignment control agent, as desired.

The alignment control agent can form various alignment states such as homeotropic alignment (vertical alignment), tilt alignment, hybrid alignment, and cholesteric alignment in addition to homogeneous alignment, and can realize a specific alignment state by more uniform and more precise control.

As an alignment control agent which promotes homogeneous alignment, for example, a low-molecular-weight alignment control agent and a high-molecular-weight alignment control agent can be used.

With regard to the low-molecular-weight alignment control agent, reference can be made to the description in, for example, paragraphs [0009] to [0083] of JP2002-020363A, paragraphs [0111] to [0120] of JP2006-106662A, and paragraphs [0021] to [0029] of JP2012-211306A, the contents of which are incorporated herein by reference.

Furthermore, with regard to the high-molecular-weight alignment control agent, reference can be made to the description in, for example, paragraphs [0021] to [0057] of JP2004-198511A and paragraphs [0121] to [0167] of JP2006-106662A, the contents of which are incorporated herein by reference.

In addition, examples of an alignment control agent which forms or promotes homeotropic alignment include a boronic acid compound and an onium salt compound, and specifically, reference can be made to the compound described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are incorporated herein by reference.

In a case where the composition contains the alignment control agent, a content of the alignment control agent is not particularly limited, but is preferably 0.01% to 10% by mass and more preferably 0.05% to 5% by mass with respect to the total solid content in the composition.

(Other Components)

The composition may contain components other than the above-mentioned components, and examples thereof include a surfactant, a tilt angle controlling agent, an alignment aid, a plasticizer, and a crosslinking agent.

(Method for Producing Optically Anisotropic Layer)

A method for producing the optically anisotropic layer is not particularly limited, and a known method is mentioned.

For example, a cured coating film (optically anisotropic layer) can be produced by applying the composition to a predetermined substrate (for example, a support layer described later) to form a coating film, and subjecting the obtained coating film to a curing treatment (irradiation with active energy rays (light irradiation treatment) and/or heating treatment). Moreover, an alignment film described later may be used, as desired.

Application of the composition can be carried out by a known method (for example, a wire bar coating method, an extrusion coating method, a direct gravure coating method, a reverse gravure coating method, and a die-coating method).

In the method for producing the optically anisotropic layer, it is preferable that an alignment treatment of a liquid crystal compound contained in the coating film is performed before the curing treatment for the coating film.

The alignment treatment can be performed by drying at room temperature (for example, 20° C. to 25° C.) or heating. In a case of a thermotropic liquid crystal compound, a liquid crystal phase formed by the alignment treatment can generally transition by a change in a temperature or pressure. In a case of a liquid crystal compound having a lyotropic property, the transition can be performed also by a compositional ratio such as an amount of a solvent.

In a case where the alignment treatment is a heating treatment, a heating time (heat-aging time) is preferably 10 seconds to 5 minutes, more preferably 10 seconds to 3 minutes, and still more preferably 10 seconds to 2 minutes.

The above-mentioned curing treatment (irradiation with active energy rays (light irradiation treatment) and/or heating treatment) for the coating film can also be referred to as a fixing treatment for fixing the alignment of the liquid crystal compound.

The fixing treatment is preferably performed by irradiation with active energy rays (preferably ultraviolet rays), and the liquid crystal is fixed by polymerization of the liquid crystal compound.

(Characteristics of Optically Anisotropic Layer)

The optically anisotropic layer is a film formed of the above-mentioned composition.

Optical characteristics of the optically anisotropic layer are not particularly limited, but it is preferable that the optically anisotropic layer functions as λ/4 plate.

The λ/4 plate is a plate having a function of converting linearly polarized light having a specific wavelength to circularly polarized light (or converting circularly polarized light to linearly polarized light), and refers to a plate (optically anisotropic layer) whose in-plane retardation Re(λ) at a specific wavelength of λ nm satisfies Re(λ)=λ/4.

This expression may be achieved at any wavelength (for example, 550 nm) in the visible light range, but the in-plane retardation Re(550) at a wavelength of 550 nm preferably satisfies a relationship of 110 nm≤Re(550)≤160 nm and more preferably satisfies 110 nm≤Re(550)≤150 nm.

It is preferable that Re(450) which is an in-plane retardation of the optically anisotropic layer measured at a wavelength of 450 nm, Re(550) which is an in-plane retardation of the optically anisotropic layer measured at a wavelength of 550 nm, and Re(650) which is an in-plane retardation of the optically anisotropic layer measured at a wavelength of 650 nm have a relationship of Re(450)≤Re(550)≤Re(650). That is, this relationship can be said to be a relationship indicating reciprocal wavelength dispersibility.

In addition, a range of Re(550)/Re(450) is not particularly limited, but is preferably 1.05 to 1.25 and more preferably 1.13 to 1.23. Moreover, a range of Re(650)/Re(550) is not particularly limited, but is preferably 1.01 to 1.25 and more preferably 1.01 to 1.10.

The optically anisotropic layer may be an A-plate or a C-plate, and is preferably a positive A-plate.

The positive A-plate can be obtained, for example, by horizontally aligning the polymerizable liquid crystal compound represented by General Formula (I).

The optically anisotropic layer may have a single-layered structure or a multi-layer structure. In a case of the multi-layer structure, the optically anisotropic layer may be a lamination layer of the A-plate (for example, positive A-plate) and the C-plate (for example, positive C-plate).

Furthermore, in a case where the optically anisotropic layer has a multi-layer structure, each layer corresponds to a layer formed of the above-mentioned composition.

A thickness of the optically anisotropic layer is not particularly limited, but is preferably 0.5 to 10 μm and more preferably 1.0 to 5 μm from the viewpoint of reduction in the thickness.

In addition, a relationship between a transmission axis of the polarizer and a slow axis of the optically anisotropic layer in the laminate is not particularly limited.

In a case where the laminate is applied to antireflection application, it is preferable that the optically anisotropic layer is a λ/4 plate, and an angle formed by the transmission axis of the polarizer and the slow axis of the optically anisotropic layer is in a range of 45° 10° (35° to 55°).

Furthermore, in a case where the laminate is applied to optical compensation application of an oblique viewing angle of an in-plane-switching (IPS) liquid crystal, it is preferable that the optically anisotropic layer has a multi-layer structure of the positive A-plate of the λ/4 plate and the positive C-plate, and the angle formed by the transmission axis of the polarizer and the slow axis of the optically anisotropic layer is in a range of 0°±10° (−10° to 10°) or a range of 90°±10° (80° to 100°).

<Other Layers>

The laminate according to the embodiment of the present invention may have other members in addition to the substrate, the polarizer, and the optically anisotropic layer, which are mentioned above.

Figure 2:
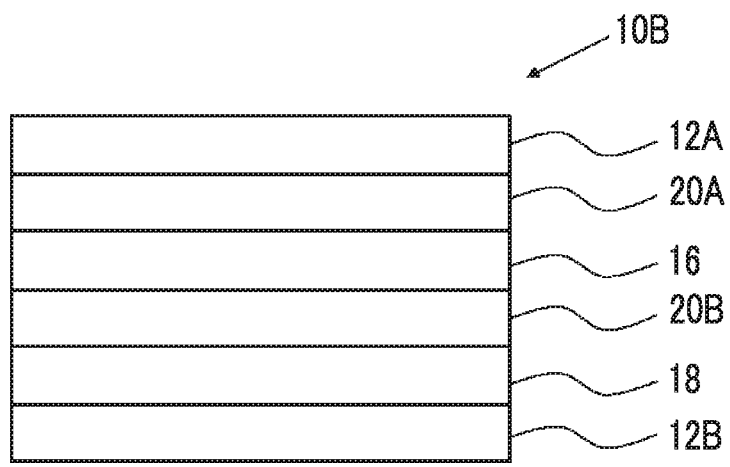
FIG. 2 is a schematic cross-sectional view showing another example of the laminate according to the embodiment of the present invention.

The laminate may further have a polarizer protective film. More specifically, as shown in FIG. 2, a laminate 10B which is another laminate according to the embodiment of the present invention has the first substrate 12A, a first polarizer protective film 20A, the polarizer 16, a second polarizer protective film 20B, the optically anisotropic layer 18, and the second substrate 12B in this order. Moreover, an aspect in which two polarizer protective films (the polarizer protective film 20A and the second polarizer protective film 20B) are provided is described in FIG. 2, but the present invention is not limited to the aspect, and an aspect in which only one of the first polarizer protective film 20A and the second polarizer protective film 20B is provided may be adopted.

In particular, the laminate preferably has a polarizer protective film on the surface of the polarizer opposed to the optically anisotropic layer. That is, a laminate in which the optically anisotropic layer, the polarizer, and the polarizer protective film are laminated in this order is preferable. Furthermore, as described later, the laminate may have a pressure sensitive adhesive layer or an adhesive layer between respective layers, and in the above aspect, the laminate may have a pressure sensitive adhesive layer or an adhesive layer between the optically anisotropic layer and the polarizer.

The configuration of the polarizer protective film is not particularly limited, and may be, for example, a transparent support or a hard coat layer, or a laminate of the transparent support and the hard coat layer.

As the hard coat layer, a known layer can be used, and for example, a layer obtained by polymerizing and curing polyfunctional monomers may be used.

In addition, as the transparent support, a known transparent support (preferably, transparent resin support) can be used. Examples of a material forming the transparent support include a cellulose-based resin (hereinafter, also referred to as cellulose acylate) typified by triacetyl cellulose, a norbornene-based resin (ZEONEX or ZEONOR manufactured by Nippon Zeon Co., Ltd., ARTON manufactured by JSR Corporation, and the like), an acrylic resin, a polyester-based resin, and a polystyrene-based resin. Among them, a cellulose-based resin or a norbornene-based resin is preferable, and a norbornene-based resin is more preferable.

Furthermore, the norbornene-based resin refers to a resin having a norbornene skeleton. More specifically, cycloolefin polymer (COP) and cycloolefin copolymer (COC) are mentioned.

A thickness of the polarizer protective film is not particularly limited, but is preferably 40 μm or less and more preferably 25 μm or less from the viewpoint that the thickness of the polarizing plate can be reduced. The lower limit is not particularly limited, but is 10 μm or more in many cases.

The laminate may include an alignment film. The alignment film is a layer having a function of defining the alignment direction of the liquid crystal compound disposed thereon. The alignment film is usually a film (layer) provided on one surface of the optically anisotropic layer.

Examples of the alignment film include a rubbing-treated film of a layer including an organic compound such as a polymer, an oblique vapor deposition film of an inorganic compound, and a film having microgrooves.

As the alignment film, a so-called photo-alignment film, which is obtained by irradiating a photo-alignment material with polarized or non-polarized light to form an alignment film, is also mentioned.

As the alignment film, a film formed by subjecting a surface of a layer (polymer layer) including an organic compound such as a polymer to a rubbing treatment is preferable. The rubbing treatment is carried out by rubbing a surface of the polymer layer several times with paper or cloth in a certain direction (preferably, the longitudinal direction of the support). Examples of the polymer used for forming the alignment film include a polyimide-based resin and a polyvinyl alcohol-based resin.

A thickness of the alignment film is not particularly limited as long as the alignment film can exhibit an alignment function, but is preferably 0.01 to 5 μm and more preferably 0.05 to 2 μm.

The laminate may have a pressure sensitive adhesive layer or an adhesive layer between respective layers in order to ensure adhesiveness between the respective layer.

Moreover, the laminate may have a transparent support between the respective layers.

The laminate may have another optically anisotropic layer in addition to the optically anisotropic layer formed of the composition containing the polymerizable liquid crystal compound represented by General Formula (I).

The other optically anisotropic layer may be an A-plate or a C-plate.

The laminate may include a touch sensor. A configuration of the touch sensor is not particularly limited, but an electrostatic capacitance-type indium tin oxide (ITO) film, a silver mesh film, a copper mesh film, and a silver nanowire film may be used. Moreover, in order to make an ITO electrode invisible, the laminate may further include a refractive index matching layer.

<Polarizing Plate>

The polarizing plate includes at least the optically anisotropic layer and the polarizer, which are described above.

A water content of the polarizing plate is 3.0 g/m$^2$ or less, and from the viewpoint that a laminate having superior thermal durability is obtained, is preferably 2.3 g/m$^2$ or less, more preferably 1.5 g/m$^2$ or less, and particularly preferably 0.8 g/m$^2$ or less. The lower limit is not particularly limited, but is 0.1 g/m$^2$ or more in many cases.

The method of adjusting the water content of the polarizing plate is not particularly limited, and examples thereof include a method of allowing the polarizing plate to stand in a predetermined environment to adjust the water content of the polarizing plate. As described later, a predetermined laminate is obtained by interposing a polarizing plate having a predetermined water content between two glass plates.

Examples of a target for the water content measurement include a polarizing plate which includes an optically anisotropic layer and a polarizer and also includes a member positioned therebetween. For example, in a case where an optically anisotropic layer, a pressure sensitive adhesive layer, a polarizer protective film, and a polarizer are arranged in this order, the target for the water content measurement corresponds to a polarizing plate including the optically anisotropic layer, the pressure sensitive adhesive layer, the polarizer protective film, and the polarizer.

In addition, in a case where a polarizer protective film is disposed on a surface of a polarizer opposed to an optically anisotropic layer side, a polarizing plate including the polarizer protective film is the target for the water content measurement. For example, in a case where an optically anisotropic layer, a pressure sensitive adhesive layer, a polarizer protective film, a polarizer, and a polarizer protective film are arranged in this order, the target for the water content measurement corresponds to a polarizing plate including the optically anisotropic layer, the pressure sensitive adhesive layer, the polarizer protective film, the polarizer, and the polarizer protective film. Moreover, for example, in a case where an optically anisotropic layer, a pressure sensitive adhesive layer, a polarizer, and a polarizer protective film are arranged in this order, the target for the water content measurement corresponds to a polarizing plate including the optically anisotropic layer, the pressure sensitive adhesive layer, the polarizer, and the polarizer protective film.

Furthermore, in a case where another member such as a touch sensor is disposed between two substrates in the laminate, and the other member does not substantially affect the water content, the water content measurement may be carried out using a measurement object including the other member and a polarizing plate.

In addition, as a method for measuring the water content, a mass obtained by converting a change amount (initial mass−dry mass) between an initial mass of a polarizing plate which is a measurement target and a dry mass of the polarizing plate after drying at 120° C. for 2 hours per unit area is used. For example, in a case where a laminate is manufactured by allowing a polarizing plate to stand in a predetermined environment to adjust a water content of the polarizing plate and interposing the polarizing plate between two glass plates, the water content of the polarizing plate immediately before being interposed between the two glass plates can be measured by the above method. Furthermore, in a case where a laminate having two substrates and a polarizing plate disposed between the two substrates is disassembled, and a water content of the polarizing plate is measured, the laminate is disassembled within 30 minutes in an environment of a temperature of 25° C. and a humidity of 60%, the polarizing plate is taken out, and the water content of the polarizing plate can be calculated by the above method.

<Method for Producing Laminate>

A method for producing the laminate is not particularly limited, and a known method is mentioned.

First, a method for producing a laminate by bonding an optically anisotropic layer formed on a predetermined support to a polarizer, then peeling off the support to produce a polarizing plate including the optically anisotropic layer and the polarizer, adjusting a water content of the polarizing plate, and interposing the polarizing plate between two substrates is mentioned.

Furthermore, in a case where the polarizing plate is produced, the optically anisotropic layer may be formed directly on the polarizer.

<Application>

The polarizing plate in the laminate according to the embodiment of the present invention is useful as an antireflection plate.

More specifically, in a case where the optically anisotropic layer in the polarizing plate is a λ/4 plate, the laminate can be suitably applied as an antireflection plate. In particular, as described above, in a case where the optically anisotropic layer in the laminate has a multi-layer structure of the positive A-plate and the positive C-plate, the total Rth of the optically anisotropic layer can be adjusted to be close to zero, and visibility in an oblique direction is improved.

Furthermore, in a case where the optically anisotropic layer has a multi-layer structure of the positive A-plate (preferably, a positive A-plate functioning as λ/4 plate) and the positive C-plate, the positive A-plate may be disposed on the polarizer side, and the positive C-plate may be disposed on the polarizer side.

In a case where the laminate is used as an antireflection plate, the laminate can be applied to various image display devices such as a liquid crystal display device, a plasma display panel, an organic electroluminescent device, and a cathode ray tube display device.

In addition, the optically anisotropic layer in the laminate according to the embodiment of the present invention is useful as an optical compensation film.

The optical compensation film is suitably used for optical compensation application of a liquid crystal display device, and can suppress tint change in a case of being viewed from the oblique direction and light leakage during black display. For example, the optical compensation film can be provided between a polarizer and a liquid crystal cell of an IPS liquid crystal display device. In particular, in the optical compensation of the IPS liquid crystal, a remarkable effect is obtained by the optically anisotropic layer in the laminate, which includes the positive A-plate and the positive C-plate.

In a case where the optically anisotropic layer has a multi-layer structure of the positive A-plate (preferably, a positive A-plate functioning as a λ/4 plate) and the positive C-plate, the positive A-plate may be disposed on the polarizer side, and the positive C-plate may be disposed on the polarizer side. Moreover, in a case where the polarizer, the positive A-plate, and the positive C-plate are arranged in this order, an angle formed by a slow axis of the positive A-plate and an absorption axis of the polarizer is preferably in a range of 90° t 10°. Furthermore, in a case where the polarizer, the positive C-plate, and the positive A-plate are arranged in this order, the slow axis of the positive A-plate and the absorption axis of the polarizer are preferably parallel to each other.

The positive A-plate and the positive C-plate preferably exhibit reciprocal wavelength dispersibility.

<Organic Electroluminescent Device and Liquid Crystal Display Device>

The laminate can be preferably used for an organic electroluminescent device (preferably, an organic electroluminescent (EL) display device) and a liquid crystal display device.

(Organic EL Display Device)

As an organic EL display device which is an example of the organic electroluminescent device according to the embodiment of the present invention, for example, an aspect in which the laminate according to the embodiment of the present invention and an organic EL display panel are provided in this order from a visual recognition side is suitably mentioned. The optically anisotropic layer included in the laminate is preferably disposed closer to the organic EL display panel side than the polarizer. In this case, the polarizing plate is used as a so-called antireflection plate.

Furthermore, out of the two substrates in the laminate according to the embodiment of the present invention, the substrate disposed on the organic EL display panel side may function as a sealing layer of the organic EL display panel. For example, in a case where the substrate is a glass substrate, out of the two glass substrates in the laminate according to the embodiment of the present invention, the glass substrate disposed on the organic EL display panel side may function as so-called sealing glass.

The organic EL display panel is a display panel constituted with an organic EL element in which an organic light emitting layer (organic electroluminescent layer) is interposed between electrodes (between a cathode and an anode). The configuration of the organic EL display panel is not particularly limited, and known configurations are adopted.

Among them, examples of the organic EL display device including the laminate include an aspect of an organic EL display device for smartphone and tablet application, and as a configuration corresponding to the laminate, cover glass/(touch sensor)/(polarizer protective film)/polarizer/(polarizer protective film)/optically anisotropic layer/(touch sensor)/glass for organic EL sealing, high barrier film, or organic EL barrier film is assumed. Moreover, members shown in parentheses in the above configuration indicate that the members are optional.

(Liquid Crystal Display Device)

A liquid crystal display device according to the embodiment of the present invention is an example of the image display device, and includes the above-mentioned laminate according to the embodiment of the present invention and a liquid crystal layer.

In addition, in the present invention, out of the polarizing plates provided on the both sides of the liquid crystal layer, it is preferable that the polarizing plate in the laminate according to the embodiment of the present invention is used as the polarizing plate on the front side, and more preferable that the polarizing plate in the laminate according to the embodiment of the present invention is used as the polarizing plates on the front and rear sides. Moreover, the optically anisotropic layer included in the polarizing plate is preferably disposed closer to the liquid crystal layer side than the polarizer. In this case, the optically anisotropic layer can be suitably used as an optical compensation film.

Furthermore, out of the two substrates in the laminate according to the embodiment of the present invention, the substrate disposed on the liquid crystal layer side may function as substrates disposed on both sides of the liquid crystal layer. For example, in a case where the substrate is a glass substrate, out of the two substrates in the laminate according to the embodiment of the present invention, the glass substrate disposed on the liquid crystal layer side may function as a glass substrate in a liquid crystal cell including a liquid crystal layer and two glass substrates interposing the liquid crystal layer.

Among them, examples of the liquid crystal display device including the laminate include an aspect of an IPS liquid crystal display device for smartphone and tablet application, and as a configuration corresponding to the laminate, cover glass/(touch sensor)/(polarizer protective film)/polarizer/(polarizer protective film)/optically anisotropic layer/glass for liquid crystal cell is assumed. Moreover, members shown in parentheses in the above configuration indicate that the members are optional.

The liquid crystal display device is preferably in a vertical alignment (VA) mode, an optical compensated bend (OCB) mode, an IPS mode, a fringe field switching (FFS) mode, or a twisted nematic (TN) mode, but is not limited thereto.

Similar to the IPS mode, the FFS mode is a mode for switching liquid crystal molecules so as to be always horizontal with respect to the surface of the liquid crystal layer, and may be considered as one of the IPS modes in the present invention.

EXAMPLES

Hereinafter, the present invention will be described in more detail with reference to Examples. However, the present invention is not limited thereto.

<Manufacture of Polarizer 1 with Protective Film>

A surface of a support of a cellulose triacetate film TJ25 "Z-TAC" (manufactured by FUJIFILM Corporation, thickness of 25 μm) was subjected to an alkali saponification treatment. Specifically, after the support was immersed in a 1.5 N sodium hydroxide aqueous solution at 55° C. for 2 minutes, the support was washed in a water-washing bath at room temperature and further neutralized with a 0.1 N sulfuric acid at 30° C. After neutralization, the support was washed in the water-washing bath at room temperature and further dried with hot air at 100° C. to obtain a polarizer protective film.

A roll-shaped polyvinyl alcohol film having a thickness of 75 μm was stretched in a machine direction (MD) in an iodine aqueous solution, and dried to obtain a polarizer 1 having a thickness of 14 μm.

The polarizer protective film was bonded to both surfaces of the polarizer 1 to manufacture a polarizer 1 with a protective film.

<Manufacture of Polarizer 2 with Protective Film>

A polarizer 2 with a protective film was manufactured according to the same procedure as in <Manufacture of Polarizer 1 with Protective Film>, except that one of the two polarizer protective films was changed to an unstretched cycloolefin film (thickness of 25 μm) whose surface was subjected to a corona treatment, the polarizer protective film was bonded to one surface of the polarizer 1, and the unstretched cycloolefin film was bonded to the other surface.

<Manufacture of Polarizer 3 with Protective Film>

A polarizer 3 with a protective film was manufactured according to the same procedure as in <Manufacture of Polarizer 1 with Protective Film>, except that the thickness of the polarizer was changed from 14 μm to 9 μm.

<Manufacture of Polarizer 4 with Protective Film>

With reference to the description in Example 1 of JP2017-194710A, a laminate film (base film/primer layer/polarizer) including a polyvinyl alcohol-based polarizer with a thickness of 4 μm was obtained. Next, the polarizer protective film manufactured in <Manufacture of Polarizer 1 with Protective Film> was bonded onto the polarizer, the base film and the primer layer were peeled off from the obtained laminate film, and the polarizer protective film manufactured in <Manufacture of Polarizer 1 with Protective Film> was bonded to an exposed surface of the polarizer to manufacture a polarizer 4 with a protective film.

<Manufacture of Polarizer 5 with Protective Film>

With reference to the description in Example 1 of JP2017-194710A, a laminate film (base film/primer layer/polarizer) including a polyvinyl alcohol-based polarizer with a thickness of 4 μm was obtained. Next, the polarizer protective film manufactured in <Manufacture of Polarizer 1 with Protective Film> was bonded onto the polarizer, the base film and the primer layer were peeled off from the obtained laminate film, and the unstretched cycloolefin film (thickness of 25 μm) was bonded to an exposed surface of the polarizer to manufacture a polarizer 5 with a protective film.

<Manufacture of Polarizer 6 with Protective Film>

A polarizer 6 with a protective film was manufactured according to the same procedure as in <Manufacture of Polarizer 1 with Protective Film>, except that the thickness of the polarizer was changed from 14 μm to 15 μm and the protective film was attached to only one surface of the polarizer.

<Manufacture of Polarizer 7 with Protective Film>

With reference to the description in Example 1 of JP2015-129826A, a linearly polarizing plate 7 including: a polyvinyl alcohol-based polarizer having a thickness of 4 μm; and an acrylic resin film HX-40UC (manufactured by Toyo Kohan Co., Ltd., thickness of 40 μm) as a protective film on one surface of the polarizer was manufactured.

Example 1: Manufacture of Laminate 1

The following compositions were put into a mixing tank and stirred to prepare a cellulose acetate solution used as a core layer cellulose acylate dope.

| Core layer cellulose acylate dope | |
|---|---|
| Cellulose acetate having acetyl substitution degree of 2.88 | 100 parts by mass |
| Polyester compound B described in Examples of JP2015-227955A | 12 parts by mass |
| The following compound G | 2 parts by mass |
| Methylene chloride (first solvent) | 430 parts by mass |
| Methanol (second solvent) | 64 parts by mass |

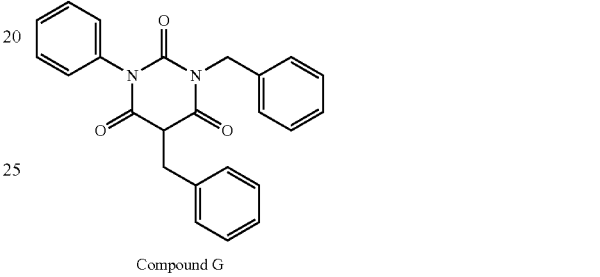

Compound G 10 parts by mass of the following matting agent solution was added to 90 parts by mass of the core layer cellulose acylate dope to prepare a cellulose acetate solution used as an outer layer cellulose acylate dope.

| Matting agent solution | |
|---|---|
| Silica particles with average particle size of 20 nm (AEROSIL R972, manufactured by NIPPON AEROSIL CO., LTD.) | 2 parts by mass |
| Methylene chloride (first solvent) | 76 parts by mass |
| Methanol (second solvent) | 11 parts by mass |
| The above core layer cellulose acylate dope | 1 part by mass |

The core layer cellulose acylate dope and the outer layer cellulose acylate dope were filtered through filter paper having an average pore diameter of 34 m and a sintered metal filter having an average pore diameter of 10 μm, and then three layers composed of the core layer cellulose acylate dope and the outer layer cellulose acylate dopes on both sides thereof were simultaneously cast from a casting port onto a drum at 20° C. (band casting machine). The film was peeled off from the drum in a state of a solvent content of approximately 20% by mass, and the both ends of the film in the width direction were fixed with a tenter clip and dried while stretching the film at a stretching ratio of 1.1 times in the transverse direction. Thereafter, the obtained film was further dried by transporting the film between rolls in a heat treatment device to manufacture an optical film having a thickness of 40 μm. The core layer of the optical film had a thickness of 36 μm and the outer layers arranged on both sides of the core layer each had a thickness of 2 μm. Re(550) of the obtained optical film was 0 nm.

Next, a coating liquid for a photo-alignment film 1 was prepared with reference to the description in Example 3 of JP2012-155308A, and applied onto the optical film with a wire bar. Thereafter, the obtained optical film was dried with hot air at 60° C. for 60 seconds to manufacture a coating film 1 having a thickness of 300 nm.

Subsequently, the following coating liquid A-1 for forming a positive A-plate was prepared.

| Composition of coating liquid A-1 for forming positive A-plate | |
|---|---|
| The following polymerizable liquid crystal compound X-1 | 20.00 parts by mass |
| The following liquid crystal compound L-1 | 40.00 parts by mass |
| The following liquid crystal compound L-2 | 40.00 parts by mass |
| The following polymerization initiator S-1 | 0.60 parts by mass |
| Leveling agent (the following compound T-1) | 0.10 parts by mass |
| Methyl ethyl ketone (solvent) | 200.00 parts by mass |
| Cyclopentanone (solvent) | 200.00 parts by mass |

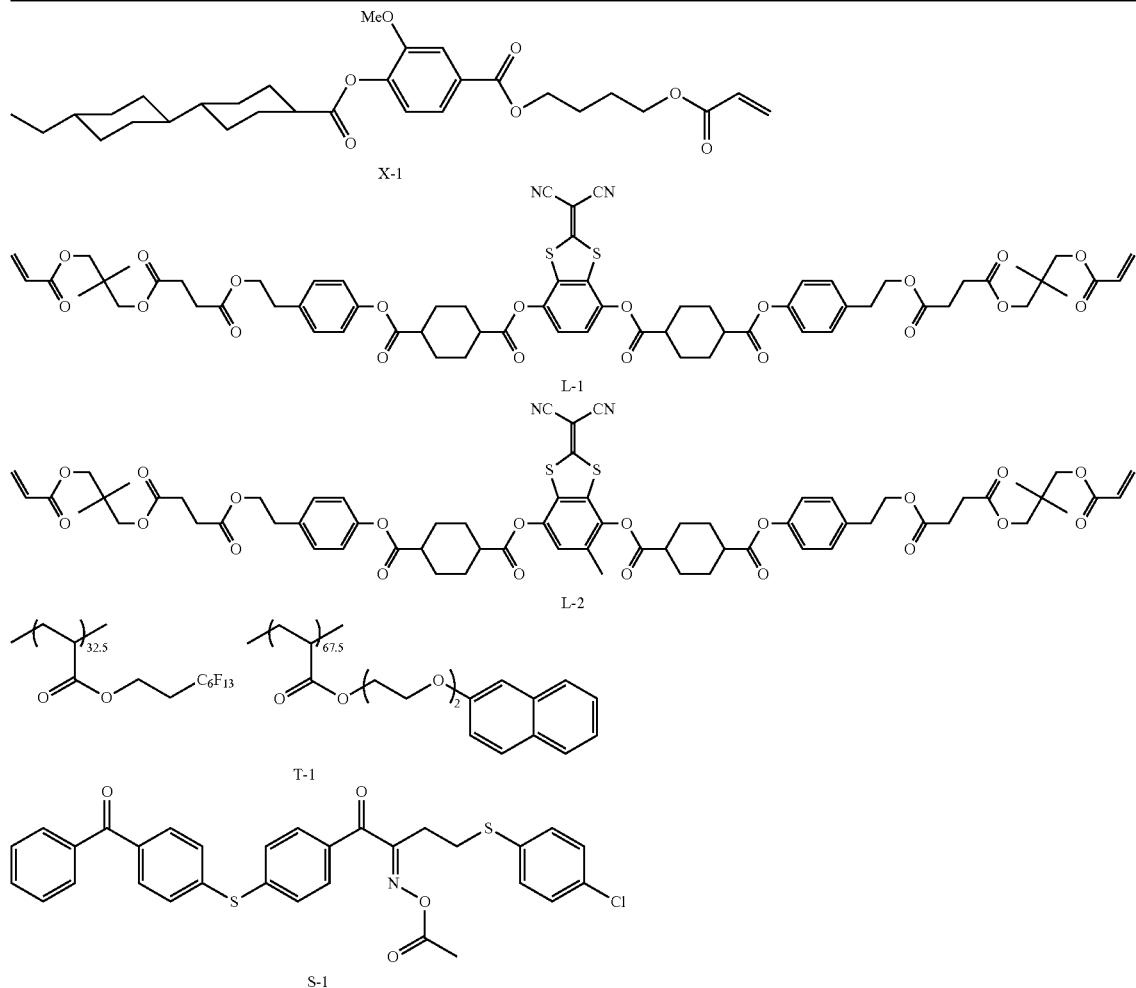

The manufactured coating film was irradiated with ultraviolet rays in air using an ultra-high-pressure mercury lamp. In this case, a wire grid polarizer (ProFlux PPL02, manufactured by Moxtek, Inc.) was set so as to be parallel to a surface of the coating film 1, exposed, and subjected to a photo-alignment treatment to obtain a photo-alignment film 1.

At that time, the illuminance of the ultraviolet rays was 10 mJ/cm$^2$ in a UV-A range (A-wave of ultraviolet rays, integration of wavelengths 320 to 380 nm).

Next, the coating liquid A-1 for forming a positive A-plate was applied onto the photo-alignment film 1 using a bar coater. The obtained coating film was heat-aged at a film surface temperature of 100° C. for 20 seconds and cooled to 90° C., and then a nematic alignment state was fixed by irradiation with 300 mJ/cm$^2$ of ultraviolet rays in air using an air-cooled metal halide lamp (manufactured by EYE GRAPHICS Co., Ltd.) to form an optically anisotropic layer 1 (positive A-plate A1), whereby an optical film with an optically anisotropic layer was obtained.

A film thickness of the formed optically anisotropic layer 1 was 2.5 μm. In the optically anisotropic layer 1, Re(550) was 145 nm, Rth(550) was 73 n, Re(550)/Re(450) was 1.15, Re(650)/Re(550) was 1.01, a tilt angle of an optical axis was 0°, and the liquid crystal compound was in homogeneous alignment.

A film with a pressure sensitive adhesive was manufactured according to the procedure in Example 1 of JP2017-134414A.

Next, a side of the optically anisotropic layer 1 in the optical film with an optically anisotropic layer was bonded to one surface of the polarizer 1 with a protective film using the film with a pressure sensitive adhesive. At that time, an angle formed by an absorption axis of the polarizer and a slow axis of the optically anisotropic layer 1 was 45°. Specifically, a pressure sensitive adhesive of the film with a pressure sensitive adhesive was bonded to one surface of the polarizer 1 with a protective film, a film in the film with a pressure sensitive adhesive was peeled off, and the optically anisotropic layer 1 in the optical film with an optically anisotropic layer was bonded to the pressure sensitive adhesive.

Subsequently, the optical film with the photo-alignment film 1 was removed from the obtained laminate by peeling at an interface between the photo-alignment film 1 and the optically anisotropic layer 1 to manufacture a polarizing plate.

A polarizing plate sample having a size of 14 cm×7 cm was cut out from the obtained polarizing plate, and a water content in the polarizing plate sample was set to 2.4 g/m² by appropriately adjusting humidity control conditions. While maintaining the water content, the polarizing plate sample was interposed between glass plates from both sides using the film with a pressure sensitive adhesive to obtain a laminate 1 including the glass plate, the polarizing plate, and the glass plate in this order.

A moisture permeability of the glass plate was measured using a water vapor permeability measuring device (AQUA-TRAN 2 (registered trademark) manufactured by MOCON, INC.) in an atmosphere of 40° C. and 90% RH, and, as a result, was less than $1.0 \times 10^{-3}$ g/m²·day.

Example 2

A laminate 2 was obtained according to the same procedure as in Example 1, except that a coating liquid A-2 for forming a positive A-plate, which will be described later, was used instead of the coating liquid A-1 for forming a positive A-plate and the water content of the polarizing plate was changed as shown in Table 1.

In addition, the water content of the polarizing plate in the laminate 2 is shown in Table 1.

Furthermore, a film thickness of the formed optically anisotropic layer 2 (positive A-plate A2) was 2.7 µm. In the optically anisotropic layer 2, Re(550) was 145 nm, Rth(550) was 73 nm, Re(550)/Re(450) was 1.15, and Re(650)/Re(550) was 1.01.

| Composition of coating liquid A-2 for forming positive A-plate | |
|---|---|
| The above polymerizable liquid crystal compound X-1 | 20.00 parts by mass |
| The above liquid crystal compound L-1 | 40.00 parts by mass |
| The above liquid crystal compound L-2 | 40.00 parts by mass |
| The above polymerization initiator S-1 | 0.60 parts by mass |
| The following polymerizable compound B-1 | 7.00 parts by mass |
| Leveling agent (the above compound T-1) | 0.10 parts by mass |
| Methyl ethyl ketone (solvent) | 200.00 parts by mass |
| Cyclopentanone (solvent) | 200.00 parts by mass |

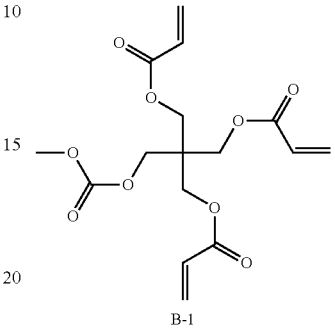

B-1

Examples 3 and 4

Laminates 3 and 4 were obtained according to the same procedure as in Example 2, except that the water contents of the polarizing plates were changed as shown in Table 1.

Examples 5 to 8

Laminates 5 to 8 were obtained according to the same procedure as in Example 2, except that the polarizers 2 to 5 with a protective film were used instead of the polarizer 1 with a protective film, the optically anisotropic layer was bonded to the side of the polarizer protective film made of Z-TAC in the polarizer with a protective film, and the water contents of the polarizing plates were changed as shown in Table 1.

Example 9

A laminate 9 was obtained according to the same procedure as in Example 1, except that a coating liquid A-3 for forming a positive A-plate, which will be described later, was used instead of the coating liquid A-1 for forming a positive A-plate and the water content of the polarizing plate was changed as shown in Table 1.

Furthermore, in the formed optically anisotropic layer 3 (positive A-plate A3), Re(550) was 130 nm, Rth(550) was 65 nm, Re(550)/Re(450) was 1.19, and Re(650)/Re(550) was 1.02.

| Composition of coating liquid A-3 for forming positive A-plate | |
|---|---|
| The following liquid crystal compound L-6 | 100.00 parts by mass |
| The above polymerization initiator S-1 | 0.60 parts by mass |
| The above polyinerizable compound B-1 | 7.00 parts by mass |
| Leveling agent (the above compound T-1) | 0.10 parts by mass |
| Methyl ethyl ketone (solvent) | 200.00 parts by mass |
| Cyclopentanone (solvent) | 200.00 parts by mass |

| Composition of coating liquid A-3 for forming positive A-plate |
| --- |

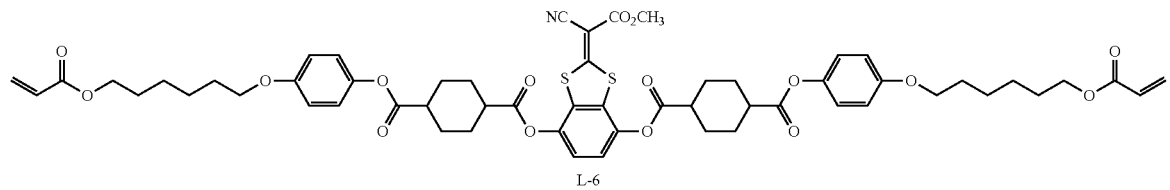 [SMILES: C=CC(=O)OCCCCCCOc1ccc(OC(=O)C2CCC(C(=O)Oc3ccc(OC(=O)C4CCC(C(=O)Oc5ccc(OCCCCCCOC(=O)C=C)cc5)CC4)c4c3SC(=C(C#N)C(=O)OC)S4)CC2)cc1]

L-6

Example 10

A laminate 10 was obtained according to the same procedure as in Example 1, except that a coating liquid A-4 for forming a positive A-plate, which will be described later, was used instead of the coating liquid A-1 for forming a positive A-plate and the water content of the polarizing plate was changed as shown in Table 1.

Furthermore, in the formed optically anisotropic layer 4 (positive A-plate A4), Re(550) was 130 nm, Rth(550) was 65 nm, Re(550)/Re(450) was 1.2, and Re(650)/Re(550) was 1.02.

| Composition of coating liquid A-4 for forming positive A-plate | |
| --- | --- |
| The following liquid crystal compound L-9 | 100.00 parts by mass |
| The above polymerization initiator S-1 | 0.60 parts by mass |
| The above polymerizable compound B-1 | 7.00 parts by mass |
| Leveling agent (the above compound T-1) | 0.10 parts by mass |
| Methyl ethyl ketone (solvent) | 200.00 parts by mass |
| Cyclopentanone (solvent) | 200.00 parts by mass |

Liquid crystal compound L-9 (the following structure)

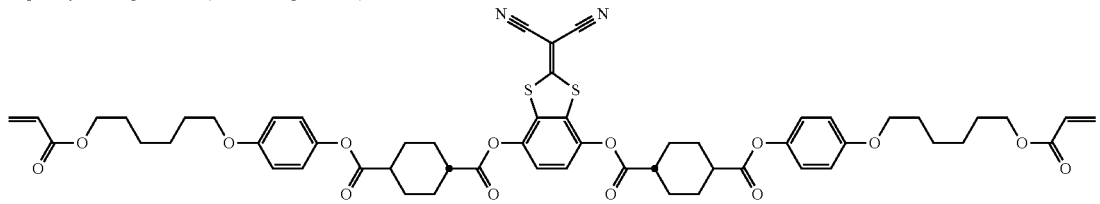

Example 11

A laminate 11 was obtained according to the same procedure as in Example 1, except that a coating liquid A-5 for forming a positive A-plate, which will be described later, was used instead of the coating liquid A-1 for forming a positive A-plate.

| Composition of coating liquid A-5 for forming positive A-plate | |
| --- | --- |
| The following liquid crystal compound L-5 | 100.00 parts by mass |
| Polymerization initiator IRGACURE 369 (BASF Japan Ltd.) | 3.00 parts by mass |
| Polymerization initiator OXE-03 (BASF Japan Ltd.) | 3.00 parts by mass |
| ADEKA ARKLS NCI-831 (ADEKA CORPORATION) | 3.00 parts by mass |
| Leveling agent BYK 361 N (BYK Japan KK) | 0.10 parts by mass |
| Antioxidant BHT (Tokyo Chemical Industry Co., Ltd.) | 0.90 parts by mass |
| Methyl ethyl ketone (solvent) | 60.00 parts by mass |
| Cyclopentanone (solvent) | 200.00 parts by mass |

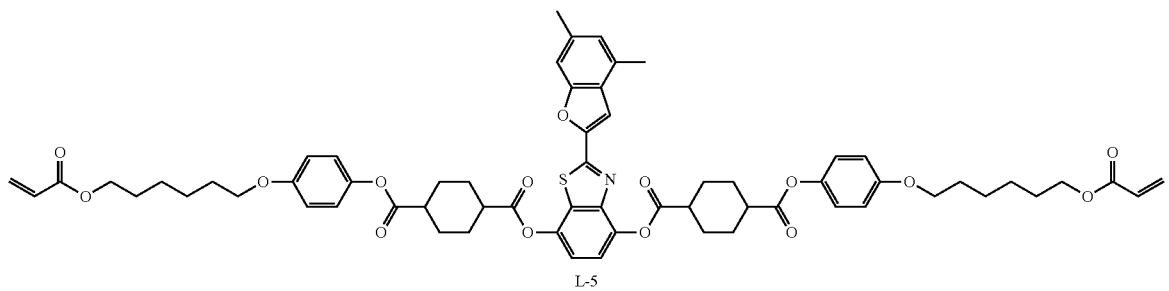 [SMILES: C=CC(=O)OCCCCCCOc1ccc(OC(=O)C2CCC(C(=O)Oc3ccc(OC(=O)C4CCC(C(=O)Oc5ccc(OCCCCCCOC(=O)C=C)cc5)CC4)c4sc(-c5cc6c(C)cc(C)cc6o5)nc34)CC2)cc1]

L-5

Example 12

A laminate 12 was obtained according to the same procedure as in Example 1, except that a coating liquid A-6 for forming a positive A-plate, which will be described later, was used instead of the coating liquid A-1 for forming a positive A-plate.

A coating liquid A-6 for forming a positive A-plate having the same composition as that of the coating liquid A-5 for forming a positive A-plate was prepared, except that a liquid crystal compound L-10 was used instead of the liquid crystal compound L-5.

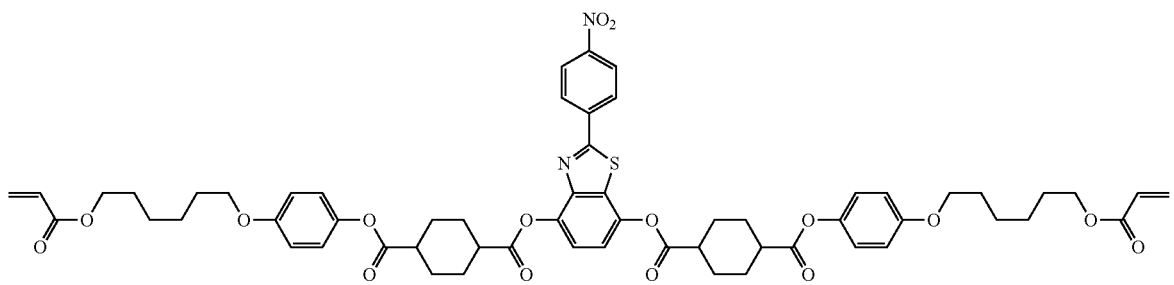

L-10

Example 13

A laminate 13 was obtained according to the same procedure as in Example 1, except that a coating liquid A-7 for forming a positive A-plate, which will be described later, was used instead of the coating liquid A-1 for forming a positive A-plate.

A coating liquid A-7 for forming a positive A-plate having the same composition as that of the coating liquid A-5 for forming a positive A-plate was prepared, except that a liquid crystal compound L-7 was used instead of the liquid crystal compound L-5.

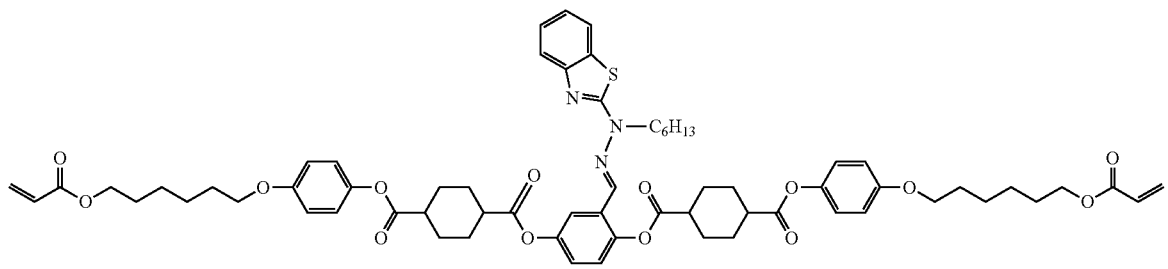

L-7

Example 14

A laminate 14 was obtained according to the same procedure as in Example 1, except that a coating liquid A-8 for forming a positive A-plate, which will be described later, was used instead of the coating liquid A-1 for forming a positive A-plate.

A coating liquid A-8 for forming a positive A-plate having the same composition as that of the coating liquid A-5 for forming a positive A-plate was prepared, except that a liquid crystal compound L-8 was used instead of the liquid crystal compound L-5.

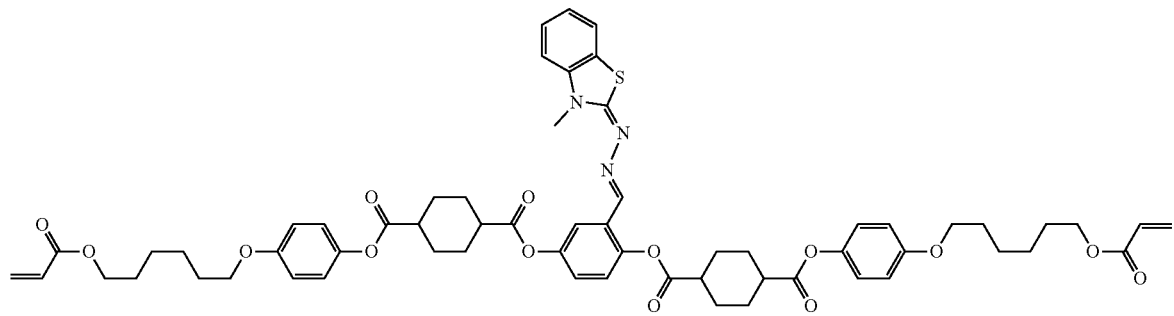

L-8

Example 15

A laminate 15 was obtained according to the same procedure as in Example 1, except that a coating liquid A-9 for forming a positive A-plate, which will be described later, was used instead of the coating liquid A-1 for forming a positive A-plate and the water content of the polarizing plate was changed as shown in Table 1.

A coating liquid A-9 for forming a positive A-plate having the same composition as that of the coating liquid A-5 for forming a positive A-plate was prepared, except that a liquid crystal compound L-13 was used instead of the liquid crystal compound L-5.

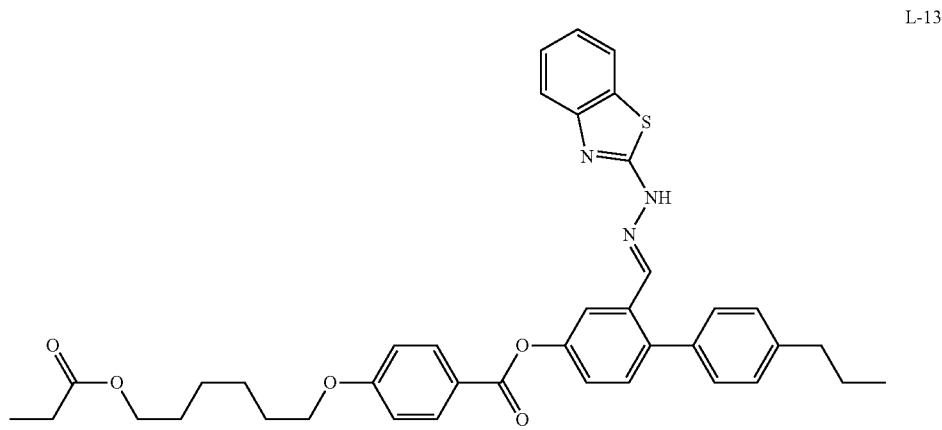 [SMILES: CCCc1ccc(-c2ccc(OC(=O)c3ccc(OCCCCCCOC(=O)CC)cc3)cc2/C=N/Nc2nc3ccccc3s2)cc1]

L-13

Example 16

A laminate 16 was obtained according to the same procedure as in Example 1, except that a coating liquid A-10 for forming a positive A-plate, which will be described later, was used instead of the coating liquid A-1 for forming a positive A-plate and the water content of the polarizing plate was changed as shown in Table 1.

A coating liquid A-10 for forming a positive A-plate having the same composition as that of the coating liquid A-5 for forming a positive A-plate was prepared, except that a liquid crystal compound L-14 was used instead of the liquid crystal compound L-5.

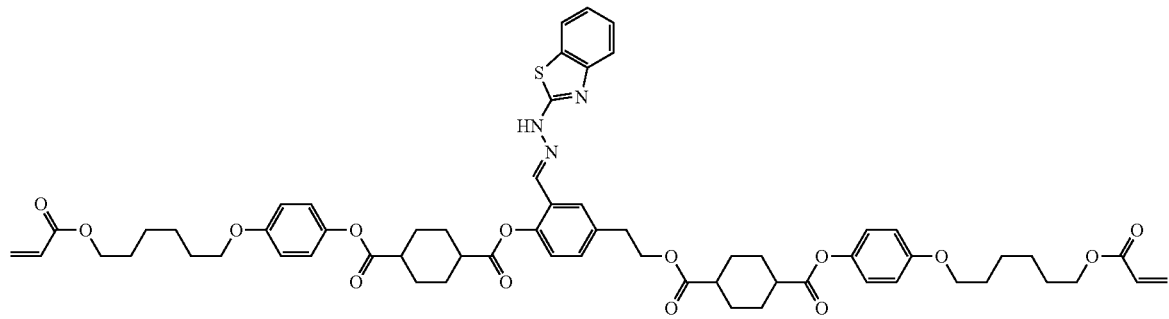

Example 17

A laminate 17 was obtained according to the same procedure as in Example 1, except that a coating liquid A-11 for forming a positive A-plate, which will be described later, was used instead of the coating liquid A-1 for forming a positive A-plate and the water content of the polarizing plate was changed as shown in Table 1.

A coating liquid A-11 for forming a positive A-plate having the same composition as that of the coating liquid A-5 for forming a positive A-plate was prepared, except that a liquid crystal compound L-15 was used instead of the liquid crystal compound L-5.

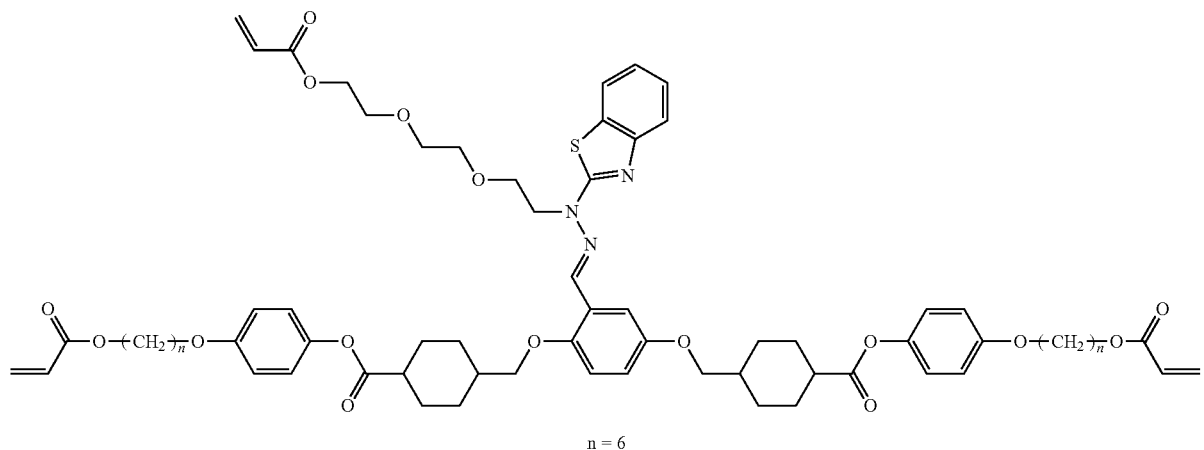

Comparative Examples 1 and 2

Laminates 18 and 19 were obtained according to the same procedure as in Example 2, except that the water contents of the polarizing plates were changed as shown in Table 1.

Comparative Example 3

A laminate 20 was obtained according to the same procedure as in Example 5, except that the water content of the polarizing plate was changed as shown in Table 1.

Comparative Example 4

A laminate 21 was obtained according to the same procedure as in Example 9, except that the water content of the polarizing plate was changed as shown in Table 1.

Comparative Example 5

A laminate 22 was obtained according to the same procedure as in Example 10, except that the water content of the polarizing plate was changed as shown in Table 1.

Comparative Example 6

A laminate 23 was obtained according to the same procedure as in Example 11, except that the water content of the polarizing plate was changed as shown in Table 1.

Comparative Example 7

A laminate 24 was obtained according to the same procedure as in Example 12, except that the water content of the polarizing plate was changed as shown in Table 1.

Comparative Example 8

A laminate 25 was obtained according to the same procedure as in Example 13, except that the water content of the polarizing plate was changed as shown in Table 1.

Comparative Example 9

A laminate 26 was obtained according to the same procedure as in Example 14, except that the water content of the polarizing plate was changed as shown in Table 1.

Comparative Example 10

A laminate 27 was obtained according to the same procedure as in Example 15, except that the water content of the polarizing plate was changed as shown in Table 1.

Comparative Example 11

A laminate 28 was obtained according to the same procedure as in Example 16, except that the water content of the polarizing plate was changed as shown in Table 1.

Comparative Example 12

A laminate 29 was obtained according to the same procedure as in Example 17, except that the water content of the polarizing plate was changed as shown in Table 1.

In addition, the water contents of the polarizing plates in Examples and Comparative Examples were adjusted by allowing the polarizer to stand in a predetermined environment before the polarizer was interposed between the two glass plates.

<Evaluation: Thermal Durability Test>

Regarding the laminates obtained in Examples and Comparative Examples, thermal durability of an in-plane retardation (Re) at a wavelength of 550 nm was evaluated using AxoScan (OPMF-1, manufactured by Axometrics, Inc.) according to the following indices. The results are shown in Table 1.

Furthermore, regarding the thermal durability test conditions, the test, in which the laminate was left in an environment of 85° C. for 400 hours, was performed. In a case where an evaluation result is "A" or higher, it can be determined that durability is favorable.

AAA: The change amount between the initial Re value and the Re value after the test was less than 1% with respect to the initial Re value AA: The change amount between the initial Re value and the Re value after the test was 1% or more and less than 3% with respect to the initial Re value A: The change amount between the initial Re value and the Re value after the test was 3% or more and less than 7% with respect to the initial Re value B: The change amount between the initial Re value and the Re value after the test was 7% or more and less than 15% with respect to the initial Re value C: The change amount between the initial Re value and the Re value after the test was 15% or more with respect to the initial Re value The results of the above evaluation test are shown in Table 1.

In addition, "Re(550)/Re(450)" in the column of "Optically anisotropic layer" in Table 1 indicates a ratio of Re(550) of the optically anisotropic layer to Re(450) of the optically anisotropic layer.

Furthermore, "Re(650)/Re(550)" in the column of "Optically anisotropic layer" in Table 1 indicates a ratio of Re(650) of the optically anisotropic layer to Re(550) of the optically anisotropic layer.

TABLE 1

| | | | Optically anisotropic layer | | | Polarizing plate | | Water content | |
| --- | --- | --- | --- | --- | --- | --- | --- | --- | --- |
| | Type of laminate | Type | Liquid crystal compound | Re(550)/Re(450) | Re(650)/Re(550) | Type | Thickness of polarizer (μm) | of polarizing plate (g/m²) | Evaluation |
| Example 1 | 1 | A1 | L-1 L-2 X-1 | 1.15 | 1.01 | 1 | 14 | 2.4 | A |
| Example 2 | 2 | A2 | L-1 L-2 X-1 | 1.15 | 1.01 | 1 | 14 | 2.9 | A |
| Example 3 | 3 | A2 | L-1 L-2 X-1 | 1.15 | 1.01 | 1 | 14 | 2.2 | AA |
| Example 4 | 4 | A2 | L-1 L-2 X-1 | 1.15 | 1.01 | 1 | 14 | 0.7 | AAA |
| Example 5 | 5 | A2 | L-1 L-2 X-1 | 1.15 | 1.01 | 2 | 14 | 1.9 | AA |
| Example 6 | 6 | A2 | L-1 L-2 X-1 | 1.15 | 1.01 | 3 | 9 | 2.7 | A |
| Example 7 | 7 | A2 | L-1 L-2 X-1 | 1.15 | 1.01 | 4 | 4 | 1.9 | AA |
| Example 8 | 8 | A2 | L-1 L-2 X-1 | 1.15 | 1.01 | 5 | 4 | 1.3 | AAA |
| Example 9 | 9 | A3 | L-6 | 1.19 | 1.02 | 1 | 14 | 2.1 | AA |
| Example 10 | 10 | A4 | L-9 | 1.2 | 1.02 | 1 | 14 | 2.3 | AA |
| Example 11 | 11 | A5 | L-5 | 1.19 | 1.02 | 1 | 14 | 2.4 | AA |
| Example 12 | 12 | A6 | L-10 | 1.2 | 1.05 | 1 | 14 | 2.4 | AA |
| Example 13 | 13 | A7 | L-7 | 1.2 | 1.02 | 1 | 14 | 2.4 | A |
| Example 14 | 14 | A8 | L-8 | 1.14 | 1.02 | 1 | 14 | 2.4 | A |

TABLE 1-continued

|  | Type of laminate | Optically anisotropic layer | | | Polarizing plate | | Water content of polarizing plate (g/m²) | Evaluation |
|---|---|---|---|---|---|---|---|---|
|  |  | Type | Liquid crystal compound | Re(550)/Re(450) | Re(650)/Re(550) | Type | Thickness of polarizer (μm) |  |  |
| Example 15 | 15 | A9 | L-13 | 1.22 | 1.02 | 1 | 14 | 2.5 | AA |
| Example 16 | 16 | A10 | L-14 | 1.2 | 1.02 | 1 | 14 | 2.5 | AA |
| Example 17 | 17 | A11 | L-15 | 1.18 | 1.02 | 1 | 14 | 2.5 | AA |
| Comparative Example 1 | 18 | A2 | L-1 L-2 X-1 | 1.15 | 1.01 | 1 | 14 | 3.3 | B |
| Comparative Example 2 | 19 | A2 | L-1 L-2 X-1 | 1.15 | 1.01 | 1 | 14 | 3.8 | C |
| Comparative Example 3 | 20 | A2 | L-1 L-2 X-1 | 1.15 | 1.01 | 2 | 14 | 3.9 | C |
| Comparative Example 4 | 21 | A3 | L-6 | 1.19 | 1.02 | 1 | 14 | 3.8 | C |
| Comparative Example 5 | 22 | A4 | L-9 | 1.2 | 1.02 | 1 | 14 | 3.8 | C |
| Comparative Example 6 | 23 | A5 | L-5 | 1.19 | 1.02 | 1 | 14 | 4 | B |
| Comparative Example 7 | 24 | A6 | L-10 | 1.2 | 1.05 | 1 | 14 | 4 | B |
| Comparative Example 8 | 25 | A7 | L-7 | 1.2 | 1.02 | 1 | 14 | 3.8 | C |
| Comparative Example 9 | 26 | A8 | L-8 | 1.14 | 1.02 | 1 | 14 | 3.8 | C |
| Comparative Example 10 | 27 | A9 | L-13 | 1.22 | 1.02 | 1 | 14 | 4 | B |
| Comparative Example 11 | 28 | A10 | L-14 | 1.2 | 1.02 | 1 | 14 | 4 | B |
| Comparative Example 12 | 29 | A11 | L-15 | 1.18 | 1.02 | 1 | 14 | 4 | B |

As shown in Table 1, it was confirmed that in a case of the laminate according to the embodiment of the present invention, a desired effect could be obtained.

In particular, from comparison of Examples 1 to 3, it was confirmed that in a case where the water content of the polarizing plate was 2.3 g/m² or less, the effect was superior.

Furthermore, from comparison of Examples 5 to 7, it was confirmed that in a case where the thickness of the polarizer was less than 10 μm, the effect was superior.

Examples 18 to 34

(Manufacture of Positive C-Plate 1)

As a temporary support, triacetyl cellulose film "Z-TAC" (manufactured by FUJIFILM Corporation) was used (the film will be referred to as a cellulose acylate film 2).

The cellulose acylate film 2 was allowed to pass through a dielectric heating roll at a temperature of 60° C., the film surface temperature was elevated to 40° C., then an alkali solution having the composition shown below was applied onto one surface of the film at an application amount of 14 ml/m² using a bar coater, and the film was transported for 10 seconds under a steam-type far infrared heater manufactured by NORITAKE CO., LIMITED while heating at 110° C.

Next, pure water was applied onto the film at 3 ml/m² using the same bar coater.

Subsequently, water-washing using a fountain coater and drainage using an air knife were repeated three times, and then, the film was transported to a drying zone at 70° C. for 10 seconds for drying to manufacture a cellulose acylate film 2 subjected to the alkali saponification treatment.

| (Alkaline solution) | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_2O)_{20}H$) | 1.0 part by mass |
| Propylene glycol | 14.8 parts by mass |

A coating liquid 2 for forming an alignment film having the following composition was continuously applied onto the cellulose acylate film 2 subjected to the alkali saponification treatment using a wire bar of #8. The obtained film was dried with hot air at 60° C. for 60 seconds and further dried with hot air at 100° C. for 120 seconds to form an alignment film.

| (Coating liquid 2 for forming alignment film) | |
|---|---|
| Polyvinyl alcohol (manufactured by KURARAY CO., LTD., PVA 103) | 2.4 parts by mass |
| Isopropyl alcohol | 1.6 parts by mass |
| Methanol | 36 parts by mass |
| Water | 60 parts by mass |

A coating liquid C-1 for forming a positive C-plate, which will be described later, was applied onto the alignment film, the obtained coating film was aged at 60° C. for 60 seconds and then irradiated with 1,000 mJ/cm² of ultraviolet rays in air using an air-cooled metal halide lamp (manufactured by EYE GRAPHICS Co., Ltd.) at 70 mW/cm², and the alignment state was fixed to vertically align a liquid crystal compound, thereby manufacturing a positive C-plate 1.

Rth(550) of the obtained positive C-plate was −60 nm.

| (Coating liquid C-1 for forming positive C-plate) | |
|---|---|
| The following liquid crystal compound L-11 | 80 parts by mass |
| The following liquid crystal compound L-12 | 20 parts by mass |
| The following vertical alignment agent (S01) for liquid crystal compound | 1 part by mass |
| Ethylene oxide-modified trimethylol propane triacrylate (V#360, manufactured by OSAKA ORGANIC CHEMICAL INDUSTRY LTD.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| The following compound B03 | 0.4 parts by mass |
| Methyl ethyl ketone | 170 parts by mass |
| Cyclohexanone | 30 parts by mass |

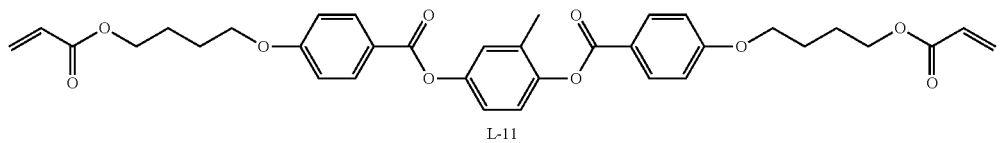

L-11

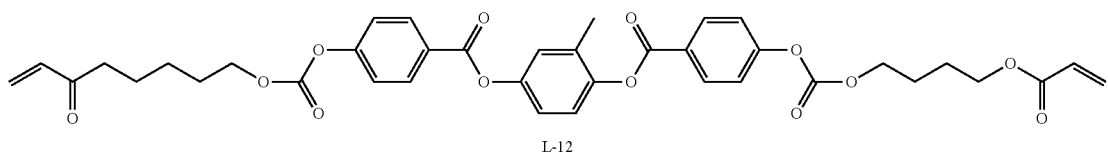 [SMILES: C=CC(=O)CCCCCOC(=O)Oc1ccc(C(=O)Oc2ccc(OC(=O)c3ccc(OC(=O)OCCCCOC(=O)C=C)cc3)c(C)c2)cc1]

L-12

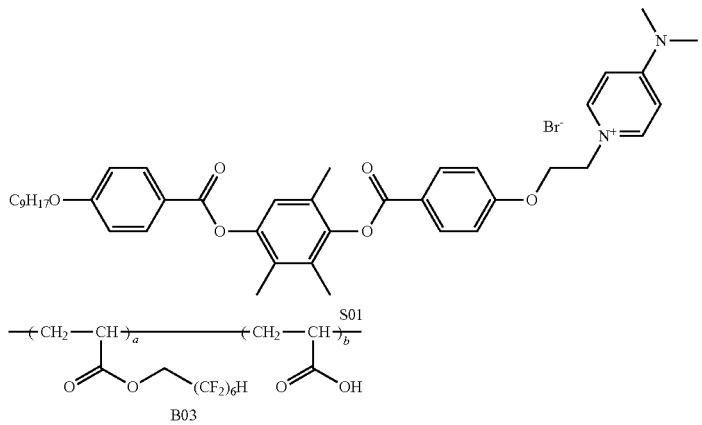

(Manufacture of Polarizing Plate)

The positive C-plate 1 manufactured above was attached onto each positive A-plate side of the polarizing plates of Examples 1 to 17 using the film with a pressure sensitive adhesive, and the alignment film and the cellulose acylate film 2 were removed to obtain polarizing plates 30 to 46.

GALAXY S5 manufactured by SAMSUNG, which has an organic EL display panel installed therein, was disassembled, a touch panel with a circularly polarizing plate was peeled from the organic EL display device, the circularly polarizing plate was further peeled from the touch panel, and the organic EL display panel (with sealing glass), the touch panel, and the circularly polarizing plate were each isolated. Subsequently, the isolated touch panel was bonded again to the organic EL display panel, the manufactured polarizing plates 30 to 46 was bonded onto the touch panel so that the side of the positive C-plate 1 was the panel side, and cover glass was further bonded thereto to manufacture an organic EL display device.

In the obtained organic EL display device, a laminate including the sealing glass (corresponding to a glass plate), the polarizing plate (any of the polarizing plates 30 to 46), and the cover glass (corresponding to a glass plate) was included.

Furthermore, the water contents of the polarizing plates 30 to 46 in a case where each polarizing plate was incorporated into the organic EL display device were the same as those of the polarizing plates 1 to 17, respectively. For example, the water content of the polarizing plate 30 was the same as the water content of the polarizing plate 1.

In the manufactured organic EL display device, it was confirmed that the polarizing plate functioned as an antireflection plate.

Example 35

According to the method described in Langmuir, 32 (36), 9245 to 9253 (2016), a monomer m-1 shown below was synthesized using 2-hydroxyethyl methacrylate (HEMA) (reagent produced by Tokyo Chemical Industry Co., Ltd.) and the following cinnamic acid chloride derivative.

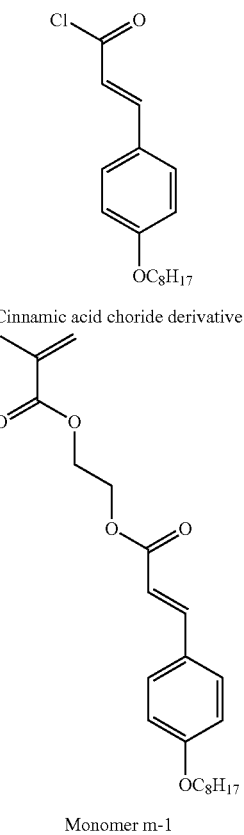

Cinnamic acid choride derivative

Monomer m-1

A flask comprising a cooling pipe, a thermometer, and a stirrer was charged with 2-butanone (5 parts by mass) as a solvent, and while flowing nitrogen in the flask at 5 mL/min, the resultant was refluxed by heating in a water bath. A solution obtained by mixing the monomer m-1 (5 parts by mass), CYCLOMER M100 (manufactured by DAICEL CORPORATION) (5 parts by mass), 2,2'-azobis(isobutyronitrile) (1 part by mass), and 2-butanone (5 parts by mass) was added dropwise into the flask over 3 hours, and the resultant was further stirred for 3 hours while maintaining a reflux state.

After the completion of the reaction, the mixture was allowed to cool to room temperature, and 2-butanone (30 parts by mass) was added into the flask for dilution to obtain a polymer solution of about 20% by mass. The obtained polymer solution was poured into a large excess of methanol to precipitate a polymer, and the recovered precipitate was filtered and washed with a large amount of methanol. Thereafter, the obtained solid content was subjected to blast drying at 50° C. for 12 hours to obtain a polymer PA-1 having a photo-aligned group.

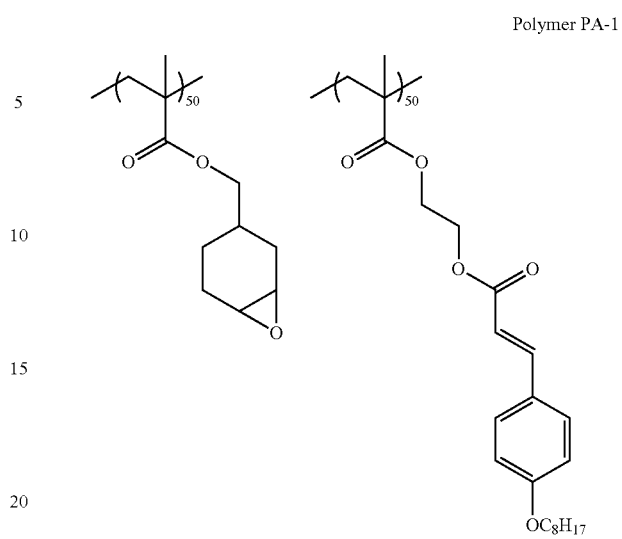

Polymer PA-1

A coating liquid for forming a photo-alignment film 2 having the following composition was continuously applied onto the optical film manufactured above using a wire bar of #2.4. The support on which the coating film was formed was dried with hot air at 140° C. for 120 seconds, and subsequently, the coating film was irradiated with polarized ultraviolet rays (10 mJ/cm², using an ultra-high-pressure mercury lamp) to form a photo-alignment film 2.

| (Coating liquid for forming photo-alignment film 2) | |
|---|---|
| The above polymer PA-1 | 100.00 parts by mass |
| Isopropyl alcohol | 16.50 parts by mass |
| Butyl acetate | 1,072.00 parts by mass |
| Methyl ethyl ketone | 268.00 parts by mass |

Subsequently, a coating liquid A-12 for forming a positive A-plate, which will be described later, was applied onto the photo-alignment film using a bar coater to form a coating film. The formed coating film was first heated on a hot plate to 110° C. and then cooled to 60° C. to stabilize the alignment of the liquid crystal compound. Thereafter, the coating film was kept at 80° C., and the alignment was fixed by irradiation with ultraviolet rays (500 mJ/cm², using an ultra-high-pressure mercury lamp) under a nitrogen atmosphere (an oxygen concentration of 100 ppm) to manufacture an optically anisotropic layer 12 (positive A-plate A12) having a thickness of 2 μm. In the obtained optically anisotropic layer 12, Re(550) was 130 n, Re(550)/Re(450) was 1.18, and Re(650)/Re(550) was 1.02.

| Composition of coating liquid A-12 for forming positive A-plate | |
|---|---|
| The above liquid crystal compound L-1 | 42.00 parts by mass |
| The above liquid crystal compound L-2 | 42.00 parts by mass |
| The above polymerizable liquid crystal compound X-1 | 12.00 parts by mass |
| The following polymerizable compound A-2 | 4.00 parts by mass |
| The above polymerization initiator S-1 (oxime-type) | 0.50 parts by mass |
| The following leveling agent T-2 | 0.23 parts by mass |
| HISOLVE MTEM | 2.00 parts by mass |

| Composition of coating liquid A-12 for forming positive A-plate | |
|---|---|
| (manufactured by TOHO Chemical Industry Co., Ltd.) NK ESTER A-200 | 1.00 part by mass |
| (manufactured by Shin-Nakamura Chemical Co., Ltd.) Methyl ethyl ketone | 424.8 parts by mass |

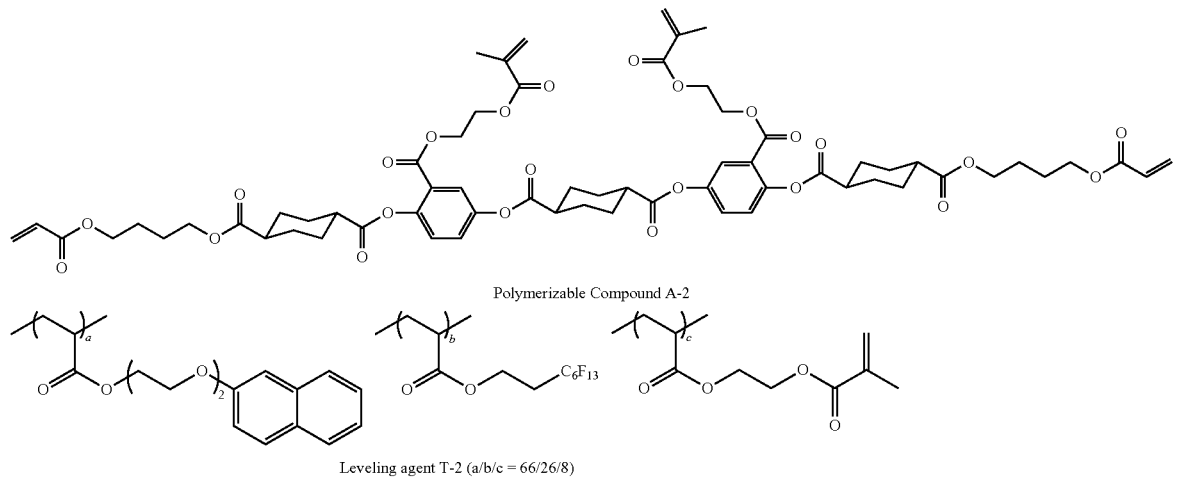

Polymerizable Compound A-2

Leveling agent T-2 (a/b/c = 66/26/8)

The surface of the optically anisotropic layer A12 was subjected to a corona treatment with a discharge amount of 150 W-min/m², and a coating liquid for forming a positive C-plate 2, which will be described later, was applied to the surface subjected to the corona treatment using a wire bar.

Next, the coating film was heated with hot air at 70° C. for 90 seconds. Thereafter, the coating film was irradiated with ultraviolet rays (300 mJ/cm²) at 40° C. under nitrogen purge (an oxygen concentration of 0.1%), the alignment of the liquid crystal compound was fixed to manufacture a positive C-plate 2 on the optically anisotropic layer 12, whereby a phase difference film having the optically anisotropic layer 12 and the positive C-plate 2 was obtained. In the obtained positive C-plate 2, Rth(550) was −100 nm and Rth(550)/Rth(450) was 1.05.

| Composition of coating liquid for forming positive C-plate 2 | |
|---|---|
| The above liquid crystal compound L-1 | 10.0 parts by mass |
| The above liquid crystal compound L-2 | 54.0 parts by mass |

| Composition of coating liquid for forming positive C-plate 2 | |
|---|---|
| The following liquid crystal compound L-16 | 28.0 parts by mass |
| The above polymerizable compound A-2 | 8.0 parts by mass |
| The following compound B-1 | 4.5 parts by mass |
| NK ESTER A-600 (manufactured by Shin-Nakamura Chemical Co., Ltd.) | 12.0 parts by mass |
| The above polymerization initiator S-1 | 1.5 parts by mass |
| The following surfactant P-2 | 0.4 parts by mass |
| The following surfactant P-3 | 0.5 parts by mass |
| Acetone | 175.0 parts by mass |
| Propylene glycol monomethyl ether acetate | 75.0 parts by mass |

Liquid crystal compound L-16

Mixture of the following liquid crystal compounds (RA), (RB), and (RC) at 83:15:2 (mass ratio)

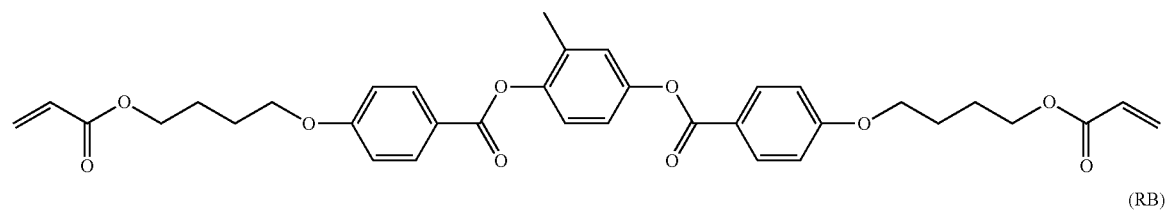

(RA)

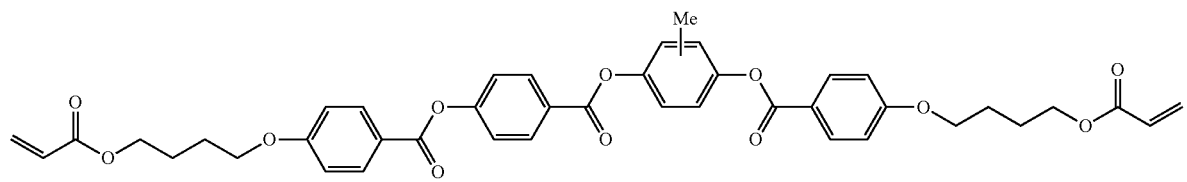

(RB)

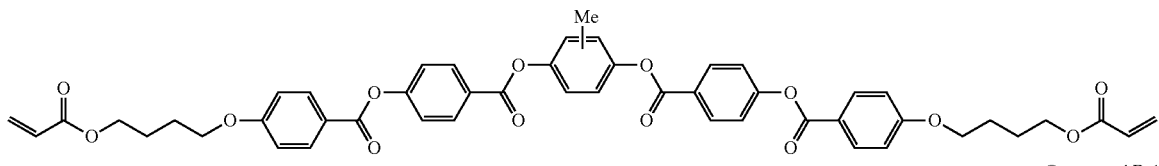

Compound B-1

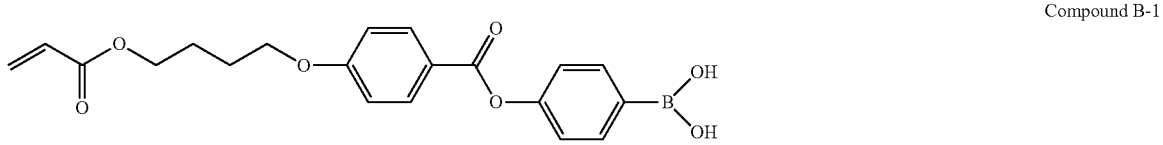

Surfactant P-2

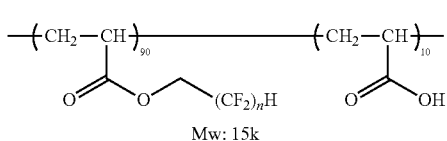

Mw: 15k
Numerical values in the structure indicate % by mass

Surfactant P-3

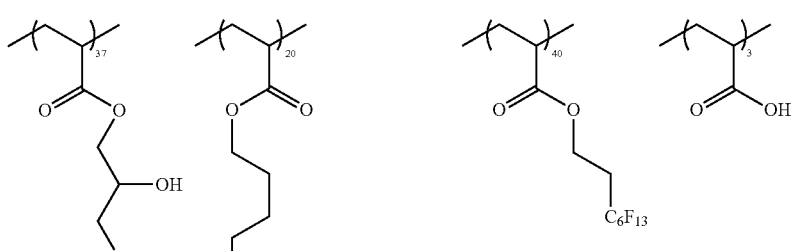

(weight-average molecular weight: 11,200)

The following compounds were mixed in the ratio described below to produce an adhesive liquid A.
ARONIX M-220 (manufactured by TOAGOSEL CO., LTD.): 20 parts by mass
4-Hydroxybutyl acrylate (manufactured by Nihon Kasei Co., Ltd.): 40 parts by mass
2-Ethylhexyl acrylate (manufactured by Mitsubishi Chemical Corporation): 40 parts by mass
Irgacure 907 (manufactured by BASF SE): 1.5 parts by mass
KAYACURE DETX-S (manufactured by Nippon Kayaku Co., Ltd.): 0.5 parts by mass The surface of the manufactured positive C-plate 2 was subjected to a corona treatment with a discharge amount of 150 W-min/m$^2$, and then the adhesive was applied so as to have a thickness of 0.5 μm. Thereafter, the surface to which the adhesive was applied was bonded to the polarizer side (surface of the polarizer) of the polarizer 6 with a protective film, and irradiation with 300 mJ/cm$^2$ of ultraviolet rays was performed from the optical film side of the phase difference film at 40° C. under an air atmosphere. The obtained film was dried at 60° C. for 3 minutes, and then the optical film with the photo-alignment film 2 was removed by peeling at an interface between the photo-alignment film 2 and the optically anisotropic layer 12 to manufacture a polarizing plate 47 having the polarizer, the positive C-plate 2, and the optically anisotropic layer 12 in this order. In this case, a direction of the slow axis of the optically anisotropic layer 12 was parallel to the absorption axis of the polarizer.

A polarizing plate sample having a size of 14 cm×7 cm was cut out from the obtained polarizing plate, and a water content in the polarizing plate sample was set to 2.8 g/m$^2$ by adjusting humidity control conditions. While maintaining the water content, the polarizing plate sample was interposed between glass plates from both sides using the film with a pressure sensitive adhesive to obtain a laminate 47 including the glass plate, the polarizing plate, and the glass plate in this order.

A moisture permeability of the glass plate was measured using a water vapor permeability measuring device (AQUA-TRAN 2 (registered trademark) manufactured by MOCON, INC.) in an atmosphere of 40° C. and 90% RH, and, as a result, was less than $1.0 \times 10^{-3}$ g/m²·day.

Example 36 and Comparative Example 13

Laminates 48 and 49 were obtained according to the same procedure as that for the laminate 47 of Example 35, except that the water contents of the polarizing plates and the types of the polarizer with a protective film were changed as shown in Table 2. Moreover, the polarizing plates manufactured by the laminate 48 are referred to as a polarizing plate 48.

Using the obtained laminates 47 to 49, the same evaluations as for Examples 1 to 17 were performed. The results are shown in Table 2.

TABLE 2

| | | | Optically anisotropic layer | | | Polarizing plate | Water content | |
| | Type of laminate | Type | Liquid crystal compound | Re(550)/Re(450) | Re(650)/Re(550) | Type | Thickness of polarizer(μm) | of polarizing plate (g/m²) | Evaluation |
| --- | --- | --- | --- | --- | --- | --- | --- | --- | --- |
| Example 35 | 47 | A12 | L-1 L-2 X-1 | 1.18 | 1.02 | 6 | 15 | 2.8 | A |
| Example 36 | 48 | A12 | L-1 L-2 X-1 | 1.18 | 1.02 | 7 | 4 | 1.1 | AAA |
| Comparative Example 13 | 49 | A12 | L-1 L-2 X-1 | 1.18 | 1.02 | 6 | 15 | 3.4 | B |

As shown in Table 2, it was confirmed that in a case of the laminate according to the embodiment of the present invention, a desired effect could be obtained.

(Manufacture of Liquid Crystal Display Device)

A commercially available liquid crystal display device (iPad (registered trademark), manufactured by Apple Inc.) (liquid crystal display device including a liquid crystal cell in the FFS mode) was disassembled, and cover glass, a touch panel, and a polarizer on a visual recognition side from a liquid crystal cell were each isolated. Next, each optically anisotropic layer in the manufactured polarizing plates 47 and 48 was bonded to the liquid crystal cell using the film with a pressure sensitive adhesive so that the optically anisotropic layer was closer to the liquid crystal cell side than the polarizer. In this case, the absorption axis of the polarizer on the backlight side of the liquid crystal display device and the absorption axis of each polarizer in the polarizing plate 47 and 48 were set to be orthogonal to each other. Subsequently, the isolated touch panel was bonded again onto each polarizer protective film of the polarizing plate 47 and 48, and the cover glass was further bonded thereto to manufacture a liquid crystal display device.

In the obtained liquid crystal display device, a laminate including the liquid crystal cell glass (corresponding to a glass plate), the polarizing plate, and the cover glass (corresponding to a glass plate) was included.

Furthermore, the water contents of the polarizing plates 47 and 48 in a case where each polarizing plate was incorporated into the liquid crystal display device were the same as the water contents of the polarizing plates in the laminates 47 and 48 in Table 2 above.

In the manufactured liquid crystal display device, it was confirmed that oblique black display performance was favorable and the polarizing plate had an optical compensation function.

EXPLANATION OF REFERENCES 10A, 10B: Laminate
12A: First substrate
12B: Second substrate
14: Polarizing plate
16: Polarizer
18: Optically anisotropic layer
20A: First polarizer protective film
20B: Second polarizer protective film

What is claimed is:

1. A laminate comprising:
two substrates; and
only one polarizing plate disposed between the two substrates,
wherein the polarizing plate has a polarizer and an optically anisotropic layer,
the polarizer contains a polyvinyl alcohol-based resin,
the optically anisotropic layer is formed of a composition containing a polymerizable liquid crystal compound represented by General Formula (I),
an end surface of the optically anisotropic layer is in contact with an outside air,
a moisture permeability of the substrate is $10^{-3}$ g/m²·day or less,
measurement of the moisture permeability of the substrate is performed using a water vapor permeability measuring device (AQUATRAN 2 (registered trademark) manufactured by MOCON, INC.) under conditions of a measuring temperature of 40° C. and a relative humidity of 90%,
a water content of the polarizing plate is 3.0 g/m² or less,
the water content of the polarizing plate is obtained by converting a change amount between an initial mass of the polarizing plate which is a measurement target and a dry mass of the polarizing plate after drying at 120° C. for 2 hours per unit area, and $$L_1\text{-}G_1\text{-}D_1\text{-}Ar\text{-}D_2\text{-}G_2\text{-}L_2 \qquad (I)$$

in General Formula (I), $D_1$ and $D_2$ each independently represent a single bond, —O—, —CO—O—, —C(=S)O—, —CR¹R²—, —CR¹R²—CR³R⁴—, —O—CR¹R²—, —CR¹R²—O—CR³R⁴—, —CO—O—CR¹R²—, —O—CO—CR¹R²—, —CR¹R²—

CR³R⁴—O—CO—, —CR¹R²—O—CO—CR³R⁴—, —CR¹R²—CO—O—CR³R⁴—, —NR¹—CR²R³—, or —CO—NR¹—, where R¹, R², R³, and R⁴ each independently represent a hydrogen atom, a fluorine atom, or an alkyl group having 1 to 4 carbon atoms;

G₁ and G₂ each independently represent an alicyclic hydrocarbon group or an aromatic hydrocarbon group, which has 5 to 8 carbon atoms and is divalent, and a methylene group contained in the alicyclic hydrocarbon group may be substituted with —O—, —S—, or —NH—;

L₁ and L₂ each independently represent a monovalent organic group, and at least one selected from the group consisting of L₁ and L₂ represents a monovalent group having a polymerizable group; and Ar represents a divalent aromatic ring group represented by General Formula (II-1), General Formula (II-2), General Formula (II-3), or General Formula (II-4), General Formulae

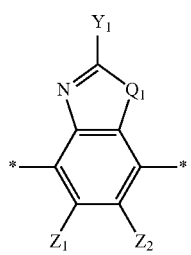

(II-1)

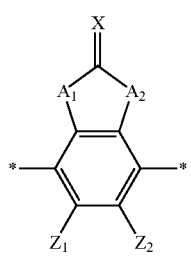

(II-2)

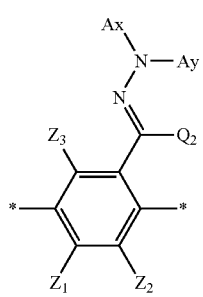

(II-3)

-continued

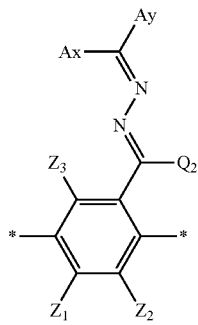

(II-4)

in General Formulae (II-1) to (II-4), Q₁ represents —S—, —O—, or —NR¹¹—, R¹¹ represents a hydrogen atom or an alkyl group having 1 to 6 carbon atoms, Y₁ represents an aromatic hydrocarbon group having 6 to 12 carbon atoms or an aromatic heterocyclic group having 3 to 12 carbon atoms, Z₁, Z₂, and Z₃ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —NR¹²R¹³, or —SR¹², Z₁ and Z₂ may be bonded to each other to form an aromatic ring or an aromatic heterocyclic ring, R¹² and R¹³ each independently represent a hydrogen atom or an alkyl group having 1 to 6 carbon atoms, A₁ and A₂ are each independently a group selected from the group consisting of —O—, —NR²¹—, —S—, and —CO—, where R²¹ represents a hydrogen atom or a substituent, X represents a hydrogen atom or a non-metallic atom of Group 14 to Group 16, to which a substituent may be bonded, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic rings in Ax and Ay may each have a substituent, Ax and Ay may be bonded to each other to form a ring, and Q₂ represents a hydrogen atom or an alkyl group having 1 to 6 carbon atoms, which may have a substituent.

2. The laminate according to claim 1, wherein the water content of the polarizing plate is 2.3 g/m² or less.

3. The laminate according to claim 1, wherein a thickness of the polarizer is less than 10 μm.

4. The laminate according to claim 1, wherein Re(450), which is an in-plane retardation of the optically anisotropic layer at a wavelength of 450 nm, Re(550), which is an in-plane retardation of the optically anisotropic layer at a wavelength of 550 nm, and Re(650), which is an in-plane retardation of the optically anisotropic layer at a wavelength of 650 nm satisfy a relationship of Re(450)≤Re(550)≤Re(650).

5. The laminate according to claim 1, wherein the optically anisotropic layer is a positive A-plate.

6. The laminate according to claim 1,
wherein the optically anisotropic layer is a λ/4 plate.

7. The laminate according to claim 1, further comprising:
a polarizer protective film on at least one surface of the polarizer,
wherein at least one polarizer protective film contains a norbornene-based resin.

8. An organic electroluminescent device comprising:
the laminate according to claim 1.

9. A liquid crystal display device comprising:
the laminate according to claim 1.

10. The laminate according to claim 2,
wherein a thickness of the polarizer is less than 10 μm.

11. The laminate according to claim 2,
wherein Re(450), which is an in-plane retardation of the optically anisotropic layer at a wavelength of 450 nm, Re(550), which is an in-plane retardation of the optically anisotropic layer at a wavelength of 550 nm, and Re(650), which is an in-plane retardation of the optically anisotropic layer at a wavelength of 650 nm satisfy a relationship of $Re(450) \leq Re(550) \leq Re(650)$.

12. The laminate according to claim 2,
wherein the optically anisotropic layer is a positive A-plate.

13. The laminate according to claim 2,
wherein the optically anisotropic layer is a λ/4 plate.

14. The laminate according to claim 2, further comprising:
a polarizer protective film on at least one surface of the polarizer,
wherein at least one polarizer protective film contains a norbornene-based resin.

15. An organic electroluminescent device comprising:
the laminate according to claim 2.

16. A liquid crystal display device comprising:
the laminate according to claim 2.

17. The laminate according to claim 3,
wherein Re(450), which is an in-plane retardation of the optically anisotropic layer at a wavelength of 450 nm, Re(550), which is an in-plane retardation of the optically anisotropic layer at a wavelength of 550 nm, and Re(650), which is an in-plane retardation of the optically anisotropic layer at a wavelength of 650 nm satisfy a relationship of $Re(450) \leq Re(550) \leq Re(650)$.

18. The laminate according to claim 3,
wherein the optically anisotropic layer is a positive A-plate.

19. An organic electroluminescent device comprising:
the laminate according to claim 3.

20. A liquid crystal display device comprising:
the laminate according to claim 3.

* * * * *